(12) United States Patent
Yamashita

(10) Patent No.: US 10,644,017 B2
(45) Date of Patent: May 5, 2020

(54) SEMICONDUCTOR DEVICE AND MANUFACTURING METHOD THEREFOR

(71) Applicant: RENESAS ELECTRONICS CORPORATION, Tokyo (JP)

(72) Inventor: Tomohiro Yamashita, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 120 days.

(21) Appl. No.: 16/036,324

(22) Filed: Jul. 16, 2018

(65) Prior Publication Data

US 2019/0081057 A1 Mar. 14, 2019

(30) Foreign Application Priority Data

Sep. 8, 2017 (JP) .................. 2017-173043

(51) Int. Cl.
| | |
|---|---|
| *H01L 27/11568* | (2017.01) |
| *H01L 27/11573* | (2017.01) |
| *H01L 29/66* | (2006.01) |
| *H01L 21/28* | (2006.01) |
| *H01L 29/51* | (2006.01) |
| *H01L 29/78* | (2006.01) |

(Continued)

(52) U.S. Cl.
CPC .. *H01L 27/11568* (2013.01); *H01L 27/11573* (2013.01); *H01L 29/40117* (2019.08); *H01L 29/42344* (2013.01); *H01L 29/513* (2013.01); *H01L 29/517* (2013.01); *H01L 29/66545* (2013.01); *H01L 29/66795* (2013.01); *H01L 29/66833* (2013.01); *H01L 29/7851* (2013.01); *H01L 29/792* (2013.01)

(58) Field of Classification Search
CPC ......... H01L 27/11568; H01L 29/42344; H01L 29/66795
See application file for complete search history.

(56) References Cited

U.S. PATENT DOCUMENTS

| | | |
|---|---|---|
| 6,369,430 B1 | 4/2002 | Adetutu et al. |
| 8,633,530 B2 | 1/2014 | Funayama et al. |

(Continued)

FOREIGN PATENT DOCUMENTS

| | | |
|---|---|---|
| JP | 2017-045860 A | 3/2017 |
| WO | 2010/082389 A1 | 7/2010 |

OTHER PUBLICATIONS

Extended European Search Report issued in corresponding European Patent Application No. 18187815.8-1212, dated Feb. 1, 2019.

*Primary Examiner* — Jose R Diaz
(74) *Attorney, Agent, or Firm* — McDermott Will & Emery LLP

(57) ABSTRACT

On the upper surface of a fin projecting from the upper surface of a semiconductor substrate, there are formed a control gate electrode through a gate insulating film and a memory gate electrode through a gate insulating film. A semiconductor region is formed in the fin beside the control gate electrode. On the semiconductor region, an insulating film, a first interlayer insulating film, and a second interlayer insulating film are formed. A plug reaching the semiconductor region is formed in the second interlayer insulating film, the first interlayer insulating film, and the insulating film. A cap film is formed between the control gate electrode and the interlayer insulating film, and the plug is positioned also right above the cap film.

18 Claims, 31 Drawing Sheets

(51) Int. Cl.
*H01L 29/792* (2006.01)
*H01L 29/423* (2006.01)

(56) References Cited

U.S. PATENT DOCUMENTS

| | | | |
|---|---|---|---|
| 9,831,318 B2 * | 11/2017 | Tokita | H01L 27/11568 |
| 10,217,759 B2 * | 2/2019 | Tsukuda | H01L 29/66833 |
| 10,217,872 B2 * | 2/2019 | Kawashima | H01L 29/785 |
| 10,411,139 B2 * | 9/2019 | Yamashita | H01L 29/665 |
| 10,439,032 B2 * | 10/2019 | Yoshitomi | H01L 29/785 |
| 2002/0097621 A1 | 7/2002 | Fujiwara | |
| 2008/0272410 A1 | 11/2008 | Lin | |
| 2013/0256767 A1 | 10/2013 | Pradhan et al. | |
| 2017/0062445 A1 | 3/2017 | Yamashita | |

* cited by examiner

| OPERATION \ APPLIED VOLTAGE | Vd | Vcg | Vmg | Vs | Vb |
|---|---|---|---|---|---|
| WRITE | Vdd | 1V | 12V | 6V | 0 |
| ERASE | 0 | 0 | -6V | 6V | 0 |
| READ | Vdd | Vdd | 0 | 0 | 0 |

Vdd = 1.5V

SEMICONDUCTOR DEVICE AND MANUFACTURING METHOD THEREFOR

CROSS-REFERENCE TO RELATED APPLICATIONS

The disclosure of Japanese Patent Application No. 2017-173043 filed on Sep. 8, 2017 including the specification, drawings and abstract is incorporated herein by reference in its entirety.

BACKGROUND

The present invention relates to a semiconductor device and a manufacturing method therefor, and, more particularly, to an effective technique applicable to a semiconductor device including a fin transistor.

The fin transistor is known as a field effect transistor, which has a high operation speed, and can reduce the leakage current and power consumption and can be miniaturized. The fin transistor (FINFET: FIN Field Effect Transistor) is a semiconductor element, having, for example, a semiconductor layer which projects over the semiconductor substrate as a channel region and having a gate electrode which is formed across and over the projecting semiconductor layer.

As an electrically writable and erasable non-volatile memory, a flash memory and an EEPROM (Electrically Erasable and Programmable Read Only Memory) are widely used. These memory units have, below the gate electrode of MISFET (Metal Insulator Semiconductor Field Effect Transistor), a conductive floating gate electrode surrounded by an oxide film or a trap insulating film, assume a charge storage state in the floating gate electrode or the trap insulating film as storage information, and read it as a threshold voltage of the transistor. This trap insulating film represents a charge storage insulating film, and is, for example, a silicon nitride film. Injection and discharge of charges to and from this charge storage layer cause the threshold voltage of the MISFET to shift, and cause it to operate as a storage element. An example of this flash memory, a split gate-type cell using a MONOS (Metal-Oxide-Nitride-Oxide-Semiconductor) structure.

International Publication 2010/082389 discloses a technique for preventing a short circuit between a control gate electrode and a contact plug, by providing an insulating film on the upper part of the control gate electrode of a non-volatile memory.

Specification of U.S. Unexamined Patent Application Publication No. 2013/0256767 discloses a technique for preventing a short circuit between the contact plug for a drain region and a gate electrode, by applying the gate electrode having a gate last structure in the FINFET and providing an insulating film on the upper part of the gate electrode.

Japanese Unexamined Patent Application Publication No. 2017-045860 discloses a technique for forming a non-volatile memory with the FINFET structure.

SUMMARY

When the non-volatile memory is formed with the FINFET structure, and further when the control gate electrode of the non-volatile memory is formed with the gate last structure, there is a risk of short-circuiting between the plug embedded in a contact hole and the control gate electrode, if the mask for forming the contact hole is misaligned, in a process for forming the contact hole for the drain region. Because a voltage is applied to each of the drain region and the control gate electrode, the risk of short-circuiting lowers in reliability of the non-volatile memory.

Any other objects and new features will be apparent from the descriptions of the present specification and the accompanying drawings.

Of preferred embodiment as will be described in the present application, the typical embodiment is briefly described as follows.

According to an embodiment, there is provided a semiconductor device having a first projecting unit, which is a part of a semiconductor substrate, and projects from an upper surface of the semiconductor substrate. The semiconductor device and its manufacturing method have a first gate electrode which is formed over an upper surface of the first projecting unit through a first gate insulating film and a second gate electrode which is formed over the upper surface of the first projecting unit through a second gate insulating film and adjacent to a one side surface of the first gate electrode through the second gate insulating film. The semiconductor device and its manufacturing method have a sidewall spacer which is formed on the other side surface of the first gate electrode, a semiconductor region which is formed in the first projecting unit beside the sidewall spacer, a first insulating film which is formed over the semiconductor region, a first interlayer insulating film which is formed over the first insulating film. The semiconductor device and its manufacturing method have a second interlayer insulating film which is formed over the first interlayer insulating film and the first gate electrode, and a plug which is formed in the second interlayer insulating film, the first interlayer insulating film, and the first insulating film, in a manner to reach the semiconductor region. A cap film is formed between the first gate electrode and the second interlayer insulating film. The plug is positioned also right over the cap film. The first interlayer insulating film and the second interlayer insulating film are formed from a material which differs from that of the first insulating film and the cap film.

According to an embodiment, there is provided a manufacturing method for a semiconductor device, having the steps of: preparing a semiconductor substrate; retreating a part of the semiconductor substrate, thereby forming a first projecting unit, which is a part of the semiconductor substrate, projects from an upper surface of the semiconductor substrate, and extends in a first direction along a main surface of the semiconductor substrate; and forming a dummy gate electrode over the upper surface and a side surface of the first projecting unit through a first insulating film. The manufacturing method for a semiconductor device has the steps of: forming a second gate insulating film over the upper surface and the side surface of the first projecting unit and over a first side surface of the dummy gate electrode; and forming a second gate electrode over the upper surface and the side surface of the first projecting unit and over a second side surface of the dummy gate electrode on a side opposed to the first side surface, through the second gate insulating film. The manufacturing method for a semiconductor device has the steps of: forming a sidewall spacer over the upper surface of the first projecting unit and over the second side surface of the dummy gate electrode; forming a semiconductor region in the first projecting unit beside the sidewall spacer, using ion implantation; forming a second insulating film over the semiconductor region; forming a first interlayer insulating film over the second insulating film. The manufacturing method for a semiconductor device has the steps of: forming an opening for exposing the first projecting unit between the sidewall spacer and the second gate insulating film, by removing the dummy gate electrode and the first insulating film; forming a first gate insulating film in the opening; embedding a first gate electrode in the opening, through the first gate insulating film; and retreating an upper surface of the first gate electrode. The manufacturing method for a semiconductor device has the steps of: forming a cap film over the first gate electrode in a manner to fill the opening; forming a second interlayer insulating film over the first interlayer insulating film and the cap film, after the step; and forming a contact hole reaching the semiconductor region, in the second interlayer insulating film, the first interlayer insulating film, and the second insulating film. The contact hole is positioned right above the cap film, and the first interlayer insulating film and the second interlayer insulating film are formed from a material which differs from that of the second insulating film and the cap film.

According to an embodiment, it is possible to improve reliability of the semiconductor device.

DETAILED DESCRIPTION

In the following preferred embodiment, if necessary for convenience sake, descriptions will be made to divided plural sections or preferred embodiment, however, unless otherwise specified, they are not mutually irrelevant, but one is in relations of modifications, details, supplementary explanations of a part or whole of the other. In the following preferred embodiment, in the case of reference to the number of elements (including the quantity, numeric value, amount, range), unless otherwise specified and unless clearly limited in principle, the present invention is not limited to the specified number, and a number over or below the specified one may be used. Further, in the following preferred embodiment, the constituent elements (including the element steps) are not necessarily indispensable, unless otherwise specified and unless considered that they are obviously required in principle. Similarly, in the preferred embodiment below, when referring to the forms, positions, and relations of the constituent elements, unless otherwise specified and unless considered that they are obviously not required in principle, substantially, those approximating or similar to the forms may be included. The same applies to the numeric value and the range.

Descriptions will now specifically be made to the preferred embodiment of the present invention based on the illustrations. In the entire drawings for explaining the preferred embodiment, the same constituent elements having the same function are identified by the same reference symbols, and thus may not be described over and over. In the preferred embodiment below, unless otherwise required, substantially, the same or similar parts are not described over and over.

In any of the drawings for use in the preferred embodiment, for the sake of clear illustrations, hatching may not be provided.

First Embodiment

Figure 1:
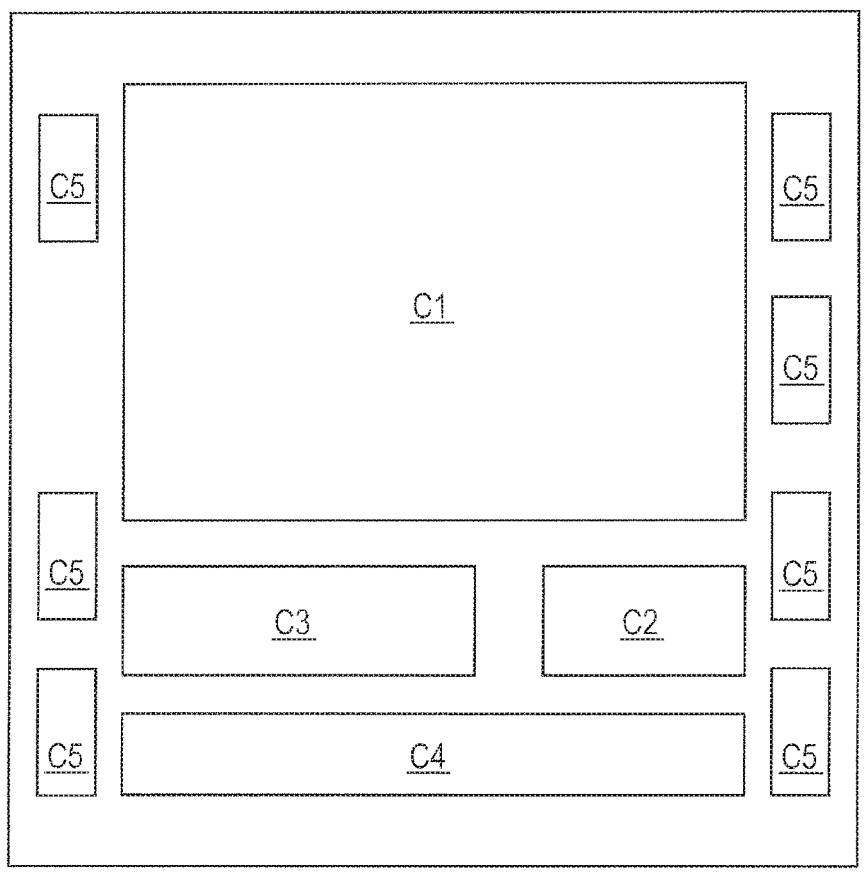
FIG. 1 is a schematic diagram illustrating a layout configuration of a semiconductor chip according to a first embodiment.

In this embodiment, descriptions will now be made to a semiconductor device having a non-volatile memory, by reference to the accompanying drawings. Descriptions will first be made to a layout configuration of the semiconductor device (a semiconductor chip) in which a system including the non-volatile memory is formed. FIG. 1 is a schematic diagram illustrating an example of a layout configuration of a semiconductor chip CHP in this embodiment. In FIG. 1, the semiconductor chip CHP has a non-volatile memory circuit C1, a CPU (Central Processing Unit) circuit C2, a RAM (Random Access Memory) circuit C3, an analog circuit C4, and an I/O (Input/Output) circuit C5.

The non-volatile memory circuit C1 has an EEPROM (Electrically Erasable Programmable Read Only Memory) and a flash memory which can electrically rewrite storage information, and is a region in which, for example, a MONOS transistor is formed, as a semiconductor element.

The CPU circuit C2 has a logic circuit which is driven by a voltage of approximately 1.5V, and is a region with a low breakdown voltage MISFET formed as a semiconductor element having low resistance and high operation speed.

The RAM circuit C3 has an SRAM (Static RAM), and is a region with a low breakdown voltage MISFET formed as a semiconductor element, having the same structure as that of the CPU circuit C2.

The analog circuit C4 has an analog circuit, and is a region having a middle breakdown voltage MISFET, a capacitive element, a resistance element, and a bipolar transistor, as semiconductor elements. The middle breakdown voltage MISFET has a breakdown voltage greater than that of the low breakdown voltage MISFET, and is driven by a voltage of approximately 6V.

The I/O circuit C5 has an input/output circuit, and is a region with a middle breakdown voltage MISFET formed as a semiconductor element approximately the same as the analog circuit C4.

<Device Structure of Semiconductor Device>

Figure 2:
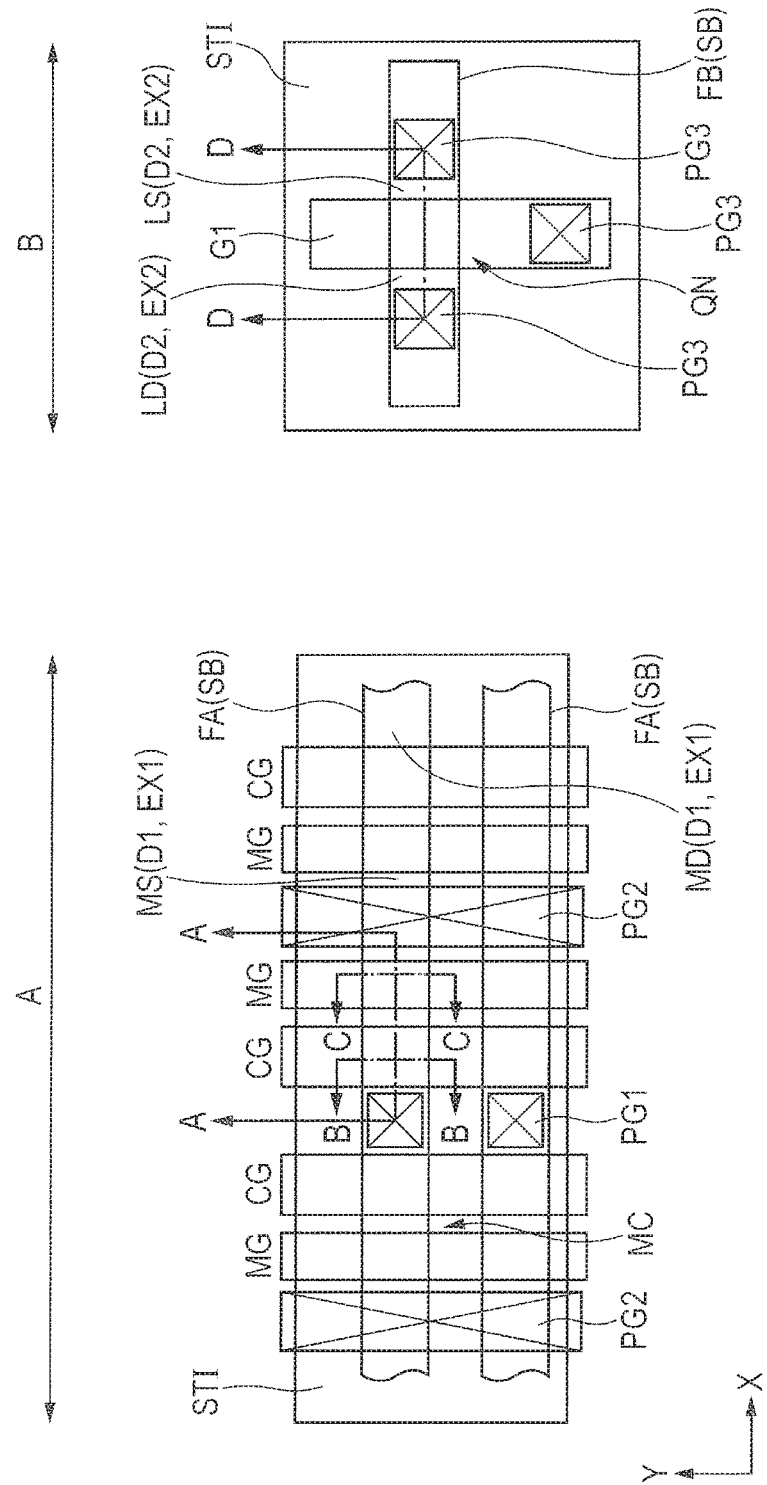
FIG. 2 is a plan view illustrating a semiconductor device according to the first embodiment.
Figure 3:
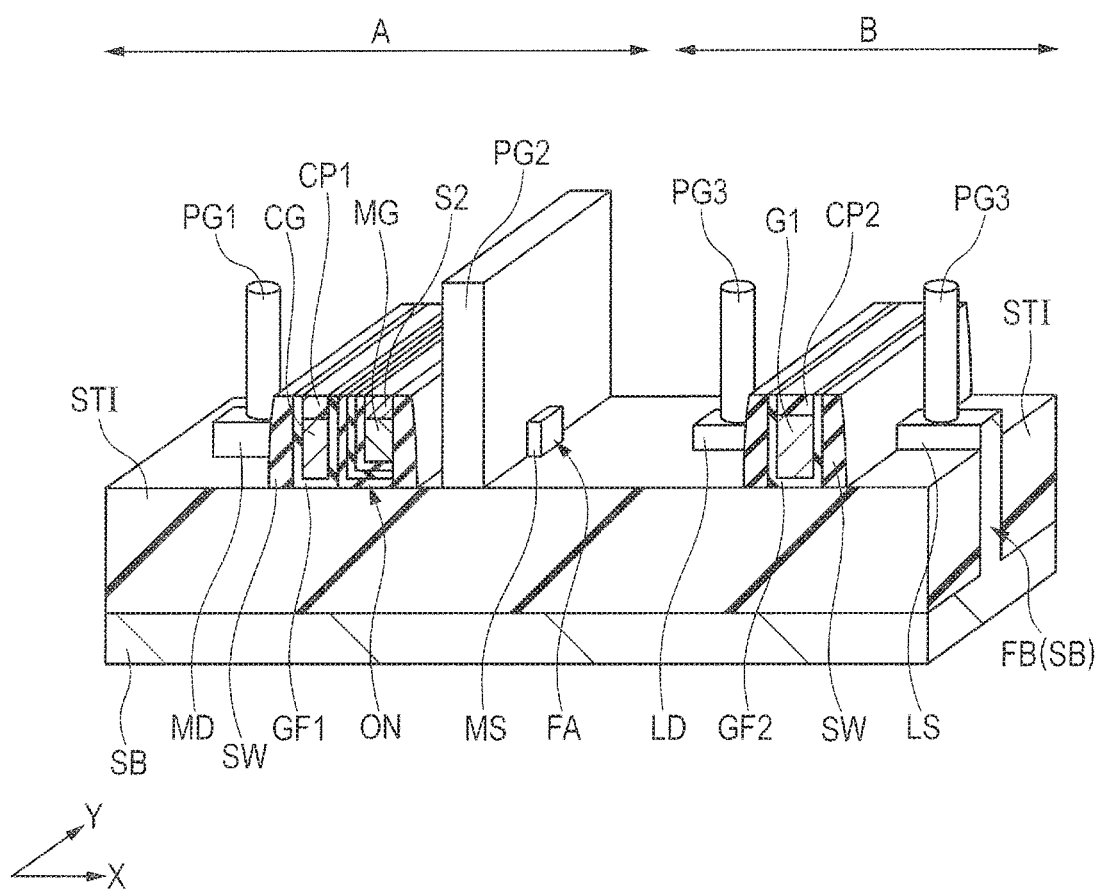
FIG. 3 is a perspective view illustrating the semiconductor device according to the first embodiment.
Figure 4:
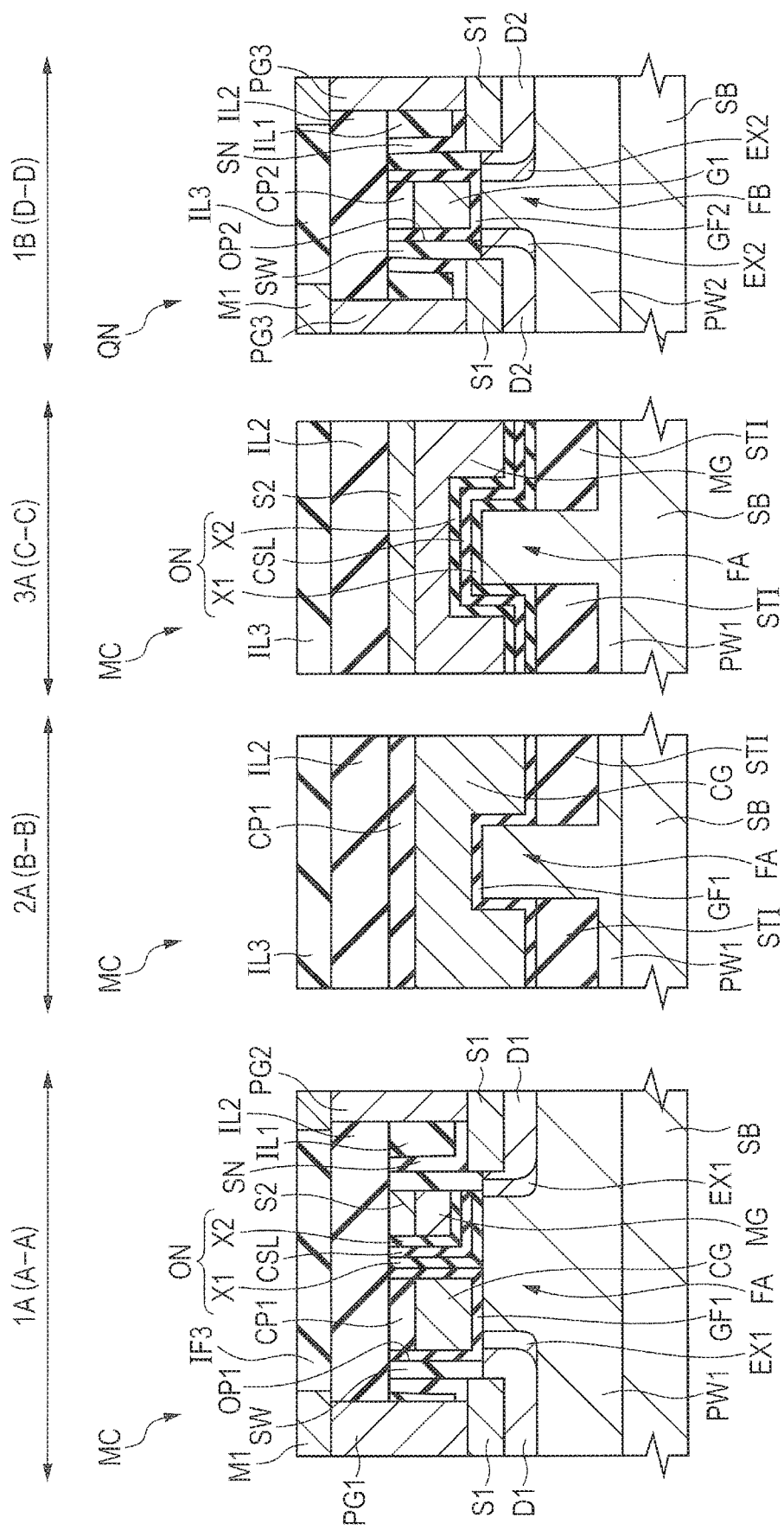
FIG. 4 is a cross sectional view illustrating the semiconductor device according to the first embodiment.

Descriptions will now be made to a structure of this embodiment, using FIG. 2 to FIG. 4. FIG. 2 is a plan view illustrating the semiconductor device of this embodiment. FIG. 3 is a perspective view illustrating the semiconductor device according to this embodiment. FIG. 4 is a cross sectional view illustrating the semiconductor device according to this embodiment. FIG. 3 does not illustrate a well.

In FIG. 2 and FIG. 3, a region A is a part of the non-volatile memory circuit C1 of FIG. 1, while a region B is a part of the CPU circuit C2.

FIG. 2 is a plan view illustrating a plurality of memory cells MC in the region A and an n-type transistor QN in the region B.

FIG. 3 is a perspective view illustrating one memory cell MC in the region A and the n-type transistor QN in the region B. Though a p-type low breakdown voltage MISFET is actually formed in the CPU circuit C2, it is not described now.

As illustrated in FIG. 2 and FIG. 3, in the region A, a plurality of fins FA extending in the direction "X" are arranged at equal intervals in the direction "Y". The direction "X" and the direction "Y" are formed along the main surface of the semiconductor substrate SB. The direction "X" is orthogonal to the direction "Y". The fin FA is a rectangular parallelepiped projecting part (protruding part) selectively projecting, for example, from the main surface of the semiconductor substrate SB, and has a wall-like form (plate-like form). The lower end part of the fin FA is enclosed by an element isolation part STI covering the main surface of the semiconductor substrate SB. The fin FA is a part of the semiconductor substrate SB, and is an active region for forming the memory cell MC. In plan view, the adjacent fins FA are isolated by the element isolation part STI.

In the region B, a fin FB extending in the direction "X" is formed. The fin FB is a rectangular parallelepiped projecting part (protruding part) selectively projecting from the main surface of the semiconductor substrate SB, and has a wall-like form (plate-like) form. The lower end part of the fin FB is enclosed by the element isolation part STI covering the main surface of the semiconductor substrate SB. The fin FB is a part of the semiconductor substrate SB, and is an active region for forming the n-type transistor QN.

It is not necessary that the fin FA and the fin FB are formed in a parallelepiped shape. In a cross sectional view along the short-side direction, the rectangular corner parts may be rounded. The side surface of the fin FA and the fin FB may be vertical to the main surface of the semiconductor substrate SB, but it may have an inclination angle close to the vertical angle. That is, in a cross sectional view, the fin FA and the fin FB may be ether in a parallelepiped shape or a trapezoidal shape. In this embodiment, as illustrated, the side surface of the fin FA and the fin FB are vertical to the main surface of the semiconductor substrate SB.

On the plurality of fins FA, a plurality of control gate electrodes CG and a plurality of memory gate electrodes MG extending in the direction "Y" are arranged. That is, the control gate electrode CG and the plurality of memory gate electrodes MG are formed on the upper surface and the side surface of the fin FA and on the element isolation part STI, through their gate insulating film GF1 and a gate insulating film ON. In the fin FA, the drain region MD on the side of the control gate electrode CG and the source region MS on the side of the memory gate electrode are formed in a manner that the control gate electrode CG and the memory gate electrode MG are sandwiched therebetween. That is, in the direction "X", the one control gate electrode CG and the one memory gate electrode MG which are adjacent to each other are positioned between the source region MS and the drain region MD. The drain region MD and the source region MS are n-type conductive semiconductor regions.

The memory cell MC is a MISFET and a non-volatile memory element. The MISFET has the control gate electrode CG, the gate insulating film GF1, the memory gate electrode MG, the gate insulating film ON, the drain region MD, and the source region MS.

The drain region MD is formed between the two control gate electrodes CG which are adjacent to each other in the direction "X". The source region MS is formed between the two memory gate electrodes MG which are adjacent to each other in the direction "X". The two memory cells MC which are adjacent to each other in the direction "X" share the drain region MD or the source region MS. The two memory cells MC sharing the drain region MD are in line symmetry in the direction "X" with the drain region MD as an axis. The two memory cells sharing the source region MS are in line symmetry in the direction "X" with the source region MS as an axis.

On the fin FB, a gate electrode G1 extending in the direction "Y" is arranged. That is, the gate electrode G1 is formed on the upper surface and the side surface of the fin FB and on the element isolation part STI part STI, through a gate insulating film GF2. In the fin FB, a drain region LD and a source region LS are formed in a manner that the gate electrode G1 is sandwiched therebetween. The drain region LD and the source region LS are n-type conductive semiconductor regions.

The n-type transistor QN is a MISFET having the gate electrode G1, the drain region LD, and the source region LS.

On each of the memory cells MC and the n-type transistor QN, interlayer insulating films IL1 and IL2 are formed. In the interlayer insulating films IL1 and IL2, plugs PG1 to PG3 are formed. In FIG. 2 and FIG. 3, the interlayer insulating films IL1 and IL2 are not illustrated. The drain region MD of each of the memory cells MC is electrically coupled to wiring M1 as a bit line, through the plug PG1, while the source region MS of each of the memory cells MC is electrically coupled to the wiring M1 as a source line, through the plug PG2. The drain region LD and the source region LS of the n-type transistor QN are electrically coupled to the wiring M1, through the plug PG3.

Descriptions will now be made to a cross sectional structure of the semiconductor device according to this embodiment, using FIG. 4.

A region 1A of FIG. 4 is illustrated in cross sectional view taken along a line A-A of FIG. 2, and is illustrated in cross sectional view along a gate length direction (direction "X") of the memory cell MC.

A region 2A of FIG. 4 is illustrated in cross sectional view taken along a line B-B of FIG. 2, and is illustrated in cross sectional view along a gate width direction (direction "Y") of the control gate electrode CG.

A region 3A of FIG. 4 is illustrated in cross sectional view taken along a line C-C of FIG. 2, and is illustrated in cross sectional view along a gate width direction (direction "Y") of the memory gate electrode MG.

A region 1B of FIG. 4 is illustrated in cross sectional view taken along a line D-D of FIG. 2, and is illustrated in cross sectional view along a gate length direction (direction "X") of the n-type transistor QN.

As illustrated in FIG. 4, the lower part of the fin FA and the fin FB is enclosed by the element isolation part STI formed on the main surface of the semiconductor substrate SB. That is, the fins are isolated by the element isolation part STI. On the semiconductor substrate SB including the fin FA, a well PW1 as a p-type conductive semiconductor region is formed. Similarly, on the semiconductor substrate SB including the fin FB, a well PW2 as a p-type conductive semiconductor region is formed.

Descriptions will now be made to a structure of the memory cell MC included in the regions 1A to 3A.

As shown in the region 1A to 3A, in the upper part of the fin FA projecting from the element isolation part STI, the control gate electrode CG is formed on the upper surface and the side surface of the fin FA through the gate insulating film GF1. In the region adjacent to the control gate electrode CG in the long-side direction (direction "X") of the fin FA, the memory gate electrode MG is formed through the insulating film ON. The insulating film ON intervenes between the control gate electrode CG and the memory gate electrode MG. The control gate electrode CG and the memory gate electrode MG are electrically separated by the insulating film ON. The insulating film ON is continuously formed to cover one side surface and the bottom surface of the memory gate electrode MG.

As shown in the region 1A and the region 2A, the gate insulating film GF1 extends along the upper surface of the fin FA, the side surface of the fin FA, and the upper surface of the element isolation part STI, in the short-side direction (direction "Y") of the fin FA. As shown in the region 1A, the gate insulating film GF1 is formed along the bottom surface and the side surface of an opening OP1 for exposing the fin FA between a sidewall spacer SW and the insulating film ON, in the long-side direction (direction "X") of the fin FA. That is, the gate insulating film GF1 is continuously formed to cover the both side surfaces and the bottom surface of the control gate electrode CG.

As shown in the region 1A and the region 2A, the control gate electrode CG extends along the upper surface of the fin FA, the side surface of the fin FA, and the upper surface of the element isolation part STI through the gate insulating film GF1, in the short-side direction (direction "Y") of the fin FA. As shown in the region 1A, the control gate electrode CG is embedded in the lower part of the opening OP1 through the gate insulating film GF1, in the long-side direction (direction "X") of the fin FA. A cap film CP1 is formed on the control gate electrode CG, and embedded in the upper part of the opening OP1 through the gate insulating film GF1. That is, in the opening OP1, the control gate electrode CG and the cap film CP1 are embedded through the gate insulating film GF1. In this manner, the control gate electrode CG of this embodiment is formed with a so-called gate last structure.

One of the main features of this embodiment is that the gate insulating film GF1 formed along the bottom surface and the side surface of the opening OP1 is formed only on the side surface of the control gate electrode CG, but also on the side surface of the cap film CP1. This feature will specifically be described later.

The gate insulating film GF1 is formed from an insulating material film having a dielectric constant greater than that of silicon oxide, that is, formed from a high dielectric constant film (High-k film). This high dielectric constant film is formed from a metal oxide film, for example, an oxide film including hafnium, an oxide film including aluminum, or an oxide film including tantalum. The gate insulating film GF1 has a thickness of, for example, 1 to 2 nm.

The upper surface and the side surface of the fin FA are thermally oxidized to form a silicon oxide film with a thickness of approximately 1 nm, between the gate insulating film GF1 and the fin FA.

The control gate electrode CG is formed from a single layered metal film including, for example, a tantalum nitride film, a titanium aluminum film, a titanium nitride film, a tungsten film or an aluminum film, or a laminated film in which any of the films are appropriately laminated.

The cap film CP1 is formed from, for example, a silicon nitride film. The cap film CP1 has a thickness of approximately 10 to 30 nm.

As shown in the region 1A and the region 3A, the insulating film ON is formed as a gate insulating film between the memory gate electrode MG and the fin FA. The insulating film ON is formed from a laminated film including an insulating film X1, a charge storage layer CSL formed on the insulating film X1, and an insulating film X2 formed on the charge storage layer CSL. The insulating film X1 is a silicon oxide film which has been formed by performing thermal oxidization for the upper surface the side surface of the fin FA, and has a thickness of 4 nm. The charge storage layer CSL is a trap insulating film which can hold charges, is a silicon nitride film which has been formed using, for example, a CVD technique, and has a thickness of 7 nm. The insulating film X2 is a silicon oxynitride film, and has a thickness of 9 nm. That is, the insulating film ON has a thickness of, for example, 20 nm, which is greater than that of the gate insulating film GF1 below the control gate electrode CG.

The charge storage layer CSL may be formed from an insulating film which is formed by nitriding hafnium or aluminum, instead of a silicon nitride film.

As shown in the region 1A and the region 3A, the memory gate electrode MG extends along the upper surface of the fin FA, the side surface of the fin FA, and the upper surface of the element isolation part STI, through the insulating film ON, in the short-side direction (direction "Y") of the fin FA. As shown in the region 1A, the memory gate electrode MG is formed on the upper surface of the fin FA and the side surface of the control gate electrode CG, through the insulating film ON, in the long-side direction (direction "X") of the fin FA. Note that the memory gate electrode MG is formed from a polycrystalline silicon film having an n-type conductivity.

A silicide layer S2 is formed on the upper surface of the memory gate electrode MG. The silicide layer S2 is formed from, for example, nickel silicide (NiSi) or cobalt silicide (CoSi$_2$). To the silicide layer S2, platinum (Pt) may be added.

As shown in the region 1A, the side surface of the pattern is covered by the sidewall spacer SW. This pattern includes the control gate electrode CG, the cap film CP1, the gate insulating film GF1, the memory gate electrode MG, the silicide layer S2, and the insulating film ON. The sidewall spacer SW is formed from a laminated structure of, for example, a silicon nitride film and a silicon oxide film.

In the fin FA of the region 1A, the source region MS and the drain region MD of the memory cell MC illustrated in FIG. 2 and FIG. 3 are formed in a manner that the upper surface of the fin FA below the control gate electrode CG and below the memory gate electrode MG is sandwiched therebetween. In FIG. 4, the source region MS and the drain region MD are illustrated as an extension region EX1 and a diffusion region D1. That is, the source region MS and the drain region MD have the extension region EX1 as an n-type semiconductor region illustrated in the region 1A of FIG. 4 and the diffusion region D1 as an n-type semiconductor region. The diffusion region D1 has an impurity concentration greater than that of the extension region EX1. The extension region EX1 and the diffusion region D1 are in contact with each other. The extension region EX1 is positioned on the side of the channel region of the memory cell MC, closer than the diffusion region D1.

On the diffusion region D1 of the source region MS and on the diffusion region D1 of the drain region MD, the silicide layer S1 is formed. The silicide layer S1 is formed from, for example, nickel silicide (NiSi). To the silicide layer S1, platinum (Pt) is added.

An etching stopper film SN (insulating film SN) formed from, for example, a silicon nitride film is formed on the fin FA and the element isolation part STI. The interlayer insulating film IL1 formed from, for example, a silicon oxide film is formed on the insulating film SN. The interlayer insulating film IL2 formed from, for example, a silicon oxide film is formed on the upper surface of each of the interlayer insulating film IL1, the cap film CP1 on the control gate electrode CG, the silicide layer S2 on the memory gate electrode MG, and the sidewall spacer SW.

In the interlayer insulating film IL, the interlayer insulating film IL1, and the insulating film SN, there are formed the plug PG1 electrically coupled to the drain region MD and the plug PG2 electrically coupled to the source region MS. The plug PG1 and the plug PG2 are formed from a barrier metal film including, for example, a titanium film, a titanium nitride film, or a laminated film of these films, or a conductive film mainly including tungsten.

As illustrated in FIG. 2, the plug PG1 is formed on the fin FA. The diameter of the plug PG1 is approximately equal to the distance between the adjacent two control gate electrodes CG, in the long-side direction (direction "X") of the fin FA. Due to the mask deviation, the plug PG1 may be formed on the control gate electrode CG. However, the cap film CP1 is formed on the control gate electrode CG, thus enabling to prevent contact between the plug PG1 and the control gate electrode CG.

The plug PG2 is formed to extend in the short-side direction (direction "Y") of the fin FA, and is coupled to the source region MS of the memory cells MC which are adjacent to each other in the short-side direction (direction "Y") of the fin FA. That is, the plug PG2 serves as the source wiring. Thus, the source regions MS of the memory cells MC can be coupled without drawing around the first wiring M1 as the upper wiring of the plug PG2. As a result, it is possible to enhance the degree of freedom of the layout of the first wiring M1.

Descriptions will now be made to a structure of the n-type transistor QN shown in the region 1B.

As shown in the region 1B, the gate insulating film GF2 is formed along the bottom surface and the side surface of an opening OP2 for exposing the fin FB between two sidewall spacers SW, in the long-side direction (direction "X") of the fin FB.

The gate electrode G1 is embedded in the lower part of the opening OP2 through the gate insulating film GF2. On the gate electrode G1, a cap film CP2 is formed, and embedded in the upper part of the opening OP2 through the gate insulating film GF2. That is, in the opening OP2, the gate electrode G1 and the cap film CP2 are embedded through the gate insulating film GF2. In this manner, the gate electrode G1 of this embodiment is formed with a so-called gate last structure.

The gate insulating film GF2 is formed from an insulating material film having a dielectric constant greater than that of silicon oxide, that is, formed from a high dielectric constant film (High-k film). This high dielectric constant film may, for example, be an oxide film including hafnium, an oxide film including aluminum, or an oxide film including tantalum. The gate insulating film GF2 has a thickness of, for example, 1 to 2 nm.

Thermal oxidation may be performed for the upper surface and the side surface of the fin FB to form a silicon oxide film with a thickness of 1 nm, between the gate insulating film GF2 and the fin FB.

The gate electrode G1 is formed from a single layered metal film including, for example, a tantalum nitride film, a titanium aluminum film, a titanium nitride film, a tungsten film or an aluminum film, or a laminated film in which any of the films are appropriately laminated.

The cap film CP2 is formed, for example, from a silicon nitride film. The cap film CP2 has a thickness of approximately 10 to 30 nm.

The side surface of the pattern including the gate electrode G1, the cap film CP2, and the gate insulating film GF2 is covered by the sidewall spacer SW. The sidewall spacer SW is formed with a laminated structure of, for example, a silicon nitride film and a silicon oxide film.

In the fin FB, the source region LS and the drain region LD of the n-type transistor QN are formed in a manner that the fin FB below the gate electrode G1 is sandwiched therebetween. In FIG. 4, the source region LS and the drain region LD are illustrated as an extension region EX2 and a diffusion region D2. That is, the source region LS and the drain region have the extension region EX2 as an n-type semiconductor region and the diffusion region D2 as an n-type semiconductor region. The diffusion region D2 has an impurity concentration greater than that of the extension region EX2. The extension region EX2 and the diffusion region D2 are in contact with each other, and the extension region EX2 is positioned on the side of the channel region of the n-type transistor QN, closer than the diffusion region D2.

The silicide layer S1 is formed on the diffusion region D2 of the source region LS and the diffusion region D2 of the drain region LD. The silicide layer S1 is formed from, for example, nickel silicide (NiSi). To the silicide layer S1, platinum (Pt) is added.

The etching stopper film SN (insulating film SN) formed from, for example, a silicon nitride film is formed on the fin FB and the element isolation part STI. The interlayer insulating film IL1 formed from, for example, a silicon oxide film is formed on the insulating film SN. The interlayer insulating film IL2 formed from, for example, a silicon oxide film is formed on the upper surface of the interlayer insulating film IL1, the cap film CP2 on the gate electrode G1, and the sidewall spacer SW.

The plug PG3 electrically coupled to the drain region LD and the source region LS is formed from the interlayer insulating film IL2, the interlayer insulating film IL1, and the insulating film SN. The plug PG3 is formed from a barrier metal film including, for example, a titanium film, a titanium nitride film, or a laminated film of these films, and a conductive film mainly including tungsten.

An interlayer insulating film IL3 is formed on the interlayer insulating film IL2 covering the memory cell MC and the n-type transistor QN. A trench for wiring is formed in the interlayer insulating film IL3. In this trench for wiring, a conductive film mainly including, for example, copper is embedded, thereby forming the wiring M1 as the first layer coupled to the plugs PG1 to PG3 in the interlayer insulating film IL3. The structure of the first wiring M1 is a so-called damascene wiring structure.

After this, using a dual damascene technique, the wiring of the second layer or further layer is formed, but is not illustrated. The wiring M1 and the wiring upper than the wiring M1 are not limited to having the Damascene wiring structure. The conductive film may be patterned and formed, and, for example, the tungsten wiring or the aluminum wiring is applicable.

<Manufacturing Process of Semiconductor Device>

Descriptions will now be made to a manufacturing method for the semiconductor device according to this embodiment, using FIG. 5 to FIG. 33.

Descriptions will now be made to a formation process for the fin FA in the region A as a part of the non-volatile memory circuit C1 illustrated in FIG. 1 and the fin FB in the region B as a part of the CPU circuit C2, using FIG. 5 to FIG. 18. FIG. 5, FIG. 7, FIG. 9, FIG. 11, FIG. 12, FIG. 14, and FIG. 16 are perspective views illustrating the formation process for the semiconductor device of this embodiment. FIG. 6, FIG. 8, FIG. 10, FIG. 13, FIG. 15, FIG. 17, and FIG. 18 are cross sectional views illustrating the formation process for the semiconductor device of this embodiment.

Figure 5:
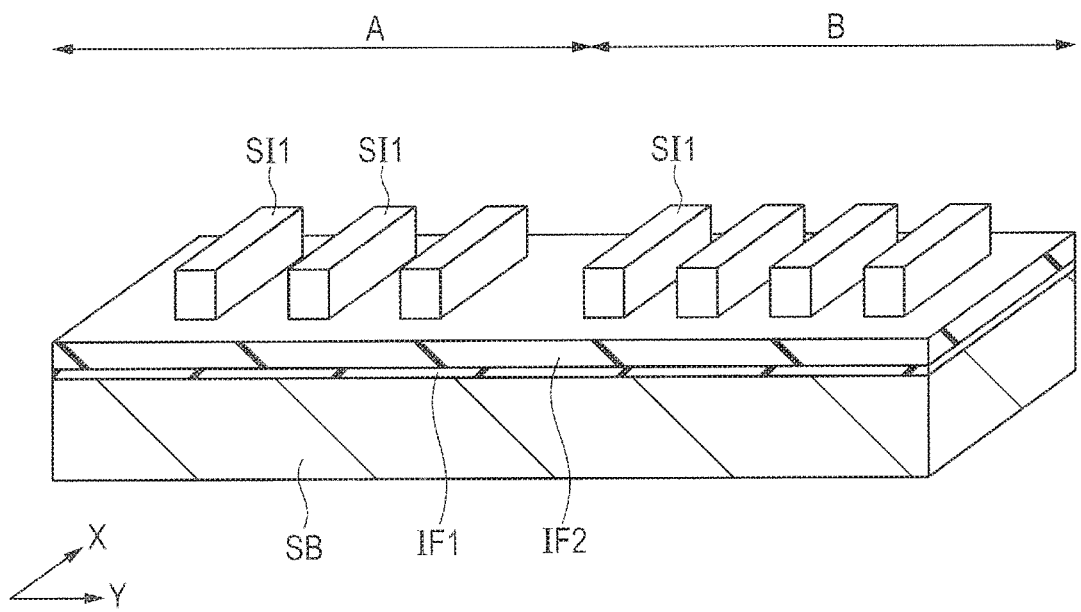
FIG. 5 is a perspective view for explaining a manufacturing process for the semiconductor device according to the first embodiment.
Figure 6:
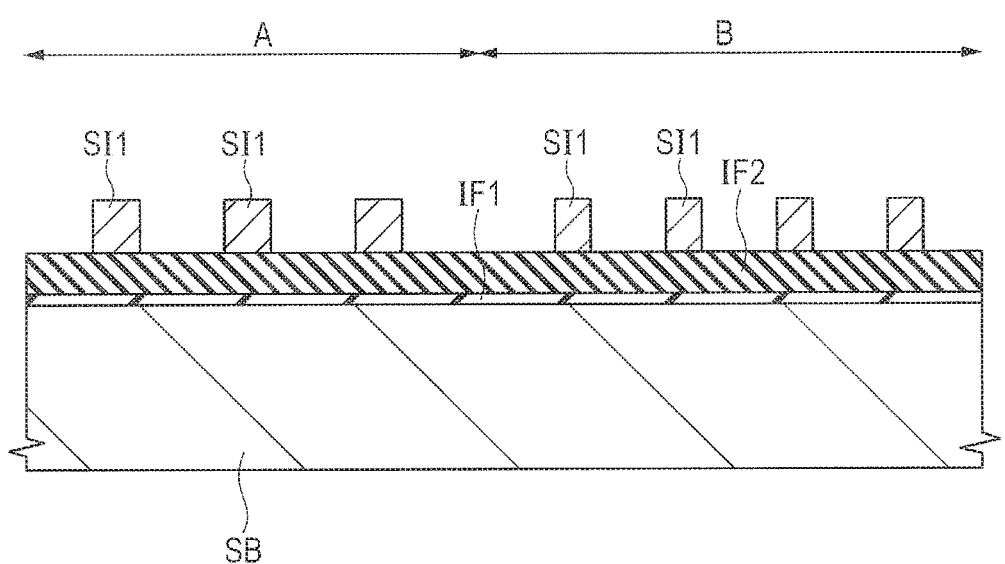
FIG. 6 is a cross sectional view along a direction "Y" of the semiconductor device in the manufacturing process, as illustrated in FIG. 5.

As illustrated in FIG. 5 and FIG. 6, a semiconductor substrate SB is prepared. Then, an insulating film IF1, an insulating film IF2, and a conductive film SI1 are sequentially formed on the main surface of the semiconductor substrate SB. The semiconductor substrate SB is formed from p-type single crystal silicon having resistivity of, for example, approximately 1 to 10 Ωcm. The insulating film IF1 is formed from, for example, a silicon oxide film, and can be formed using, for example, a thermal oxidation technique or a CVD (Chemical Vapor Deposition) technique. The insulating film IF1 has a thickness of 2 to 10 nm. The insulating film IF2 is formed from, for example, a silicon nitride film, using, for example, a CVD technique. The insulating film IF2 has a thickness of 20 to 100 nm. The conductive film SI1 is formed from, for example, a silicon film, using, for example, a CVD technique. The conductive film SI1 has a thickness of, for example, 20 to 200 nm. The conductive film SI1 of the region A and the region B is processed using a photolithography technique and an etching technique. As a result, a plurality of patterns of the conductive films SI1 extending in the direction "X" are formed in the direction "Y" on the insulating film IF2.

Figure 7:
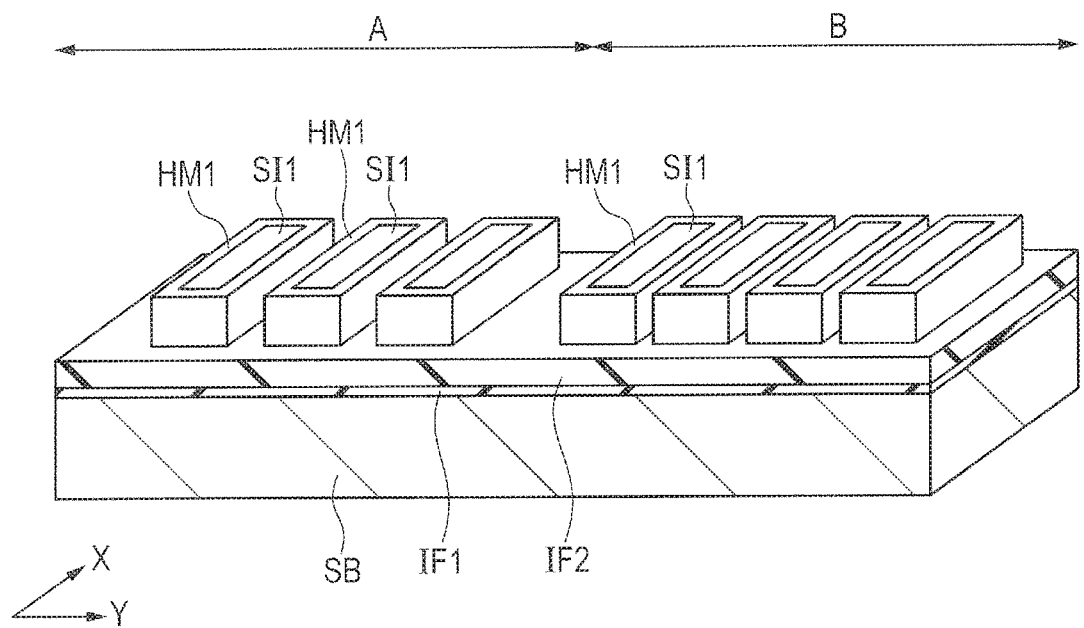
FIG. 7 is a perspective view for explaining a manufacturing process for the semiconductor device, after that of FIG. 5.
Figure 8:
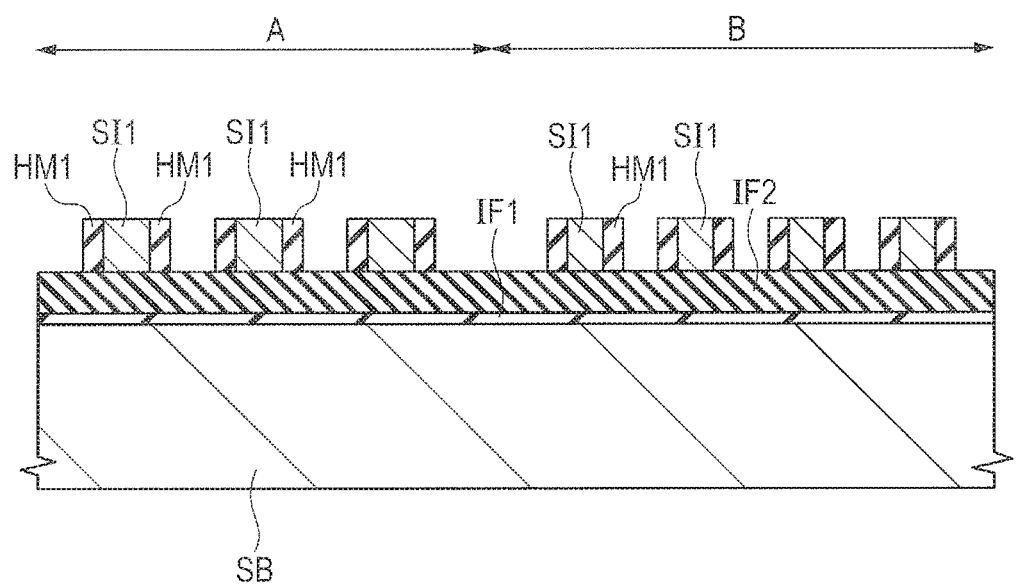
FIG. 8 is a cross sectional view along the direction "Y" of the semiconductor device in the manufacturing process, as illustrated in FIG. 7.

As illustrated in FIG. 7 and FIG. 8, a hard mask HM1 covering the side surface of each of the conductive films SI1 is formed. After a silicon oxide film having a thickness of 10 to 40 nm is formed on the semiconductor substrate SB using, for example, a CVD technique, dry etching as anisotropic etching is performed. By this, the surface of each of the insulating film IF2 and the conductive film SI1 is exposed, thereby forming the hard mask HM1 remaining on the side surface of the conductive film SI1. The hard mask HM1 is not completely embedded between the adjacent conductive films SI1, and is formed in an annular form to enclose each of the conductive films SI1.

After this, the conductive film SI1 is removed using a wet etching technique.

Figure 9:
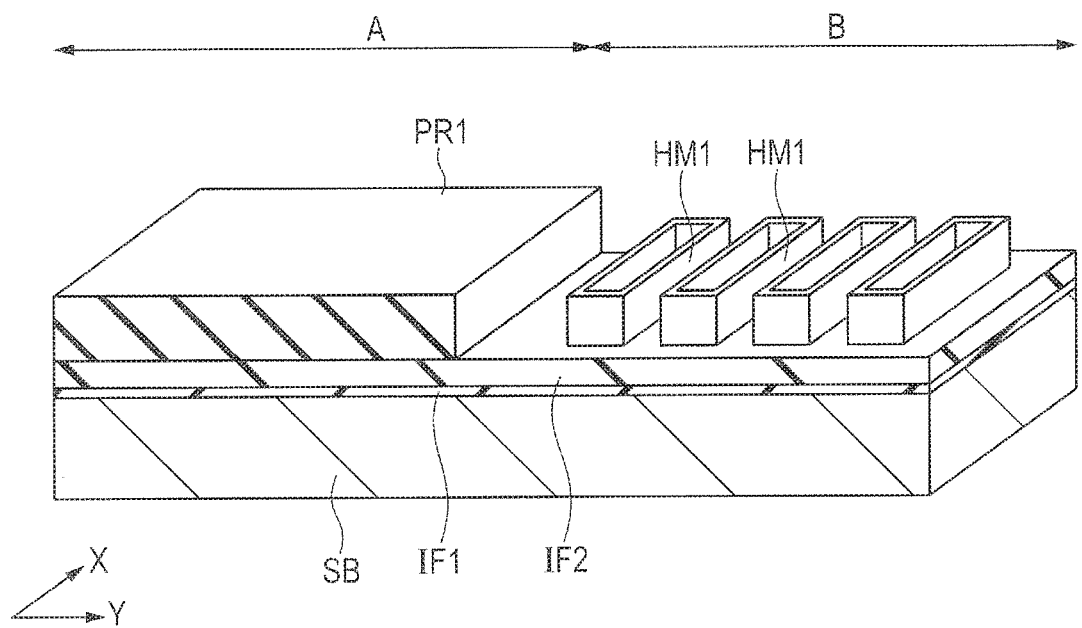
FIG. 9 is a perspective view for explaining a manufacturing process for the semiconductor device, after that of FIG. 7.
Figure 10:
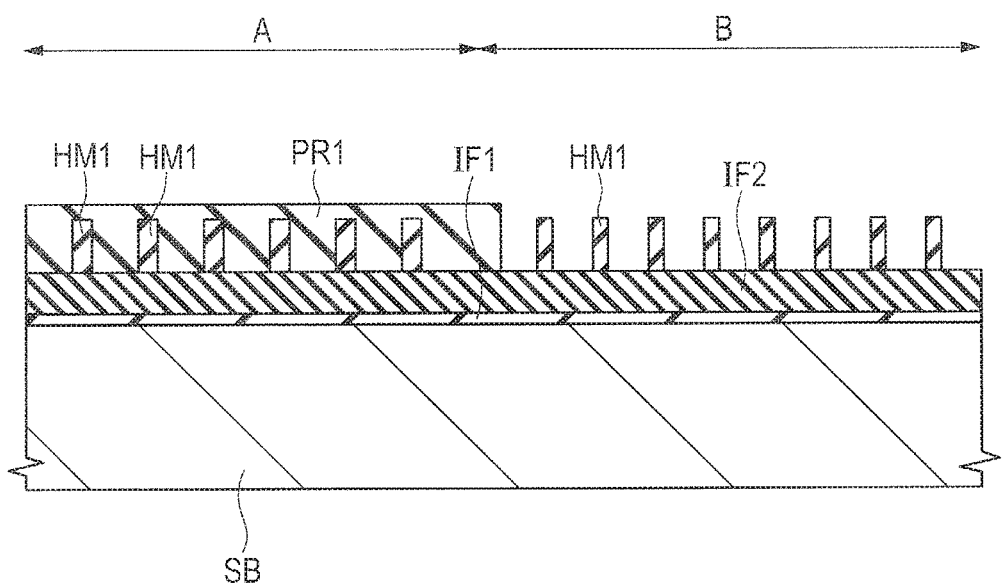
FIG. 10 is a cross sectional view along the direction "Y" of the semiconductor device in the manufacturing process illustrated in FIG. 9.

As illustrated in FIG. 9 and FIG. 10, there is formed a resist pattern PR1 covering the hard mask HM1 of the region A and for exposing the hard mask HM1 of the region B. Next, the wet etching results in removing a part of the surface of the hard mask HM1 of the region B. This results in narrowing the width of the hard mask HM1 of the region B. In this application, "width" represents the length of the pattern in a direction along the main surface of the semiconductor substrate SB.

The hard mask HM1 is used for forming the fin. Thus, as described above, it is possible to provide a difference between the width of the fin formed in the region A and the width of the fin formed in the region B, by providing a difference between the width of the hard mask HM1 of the region A and the width of the hard mask HM1 of the region B.

After this, the resist pattern PR1 is removed by performing an asking process.

Figure 11:
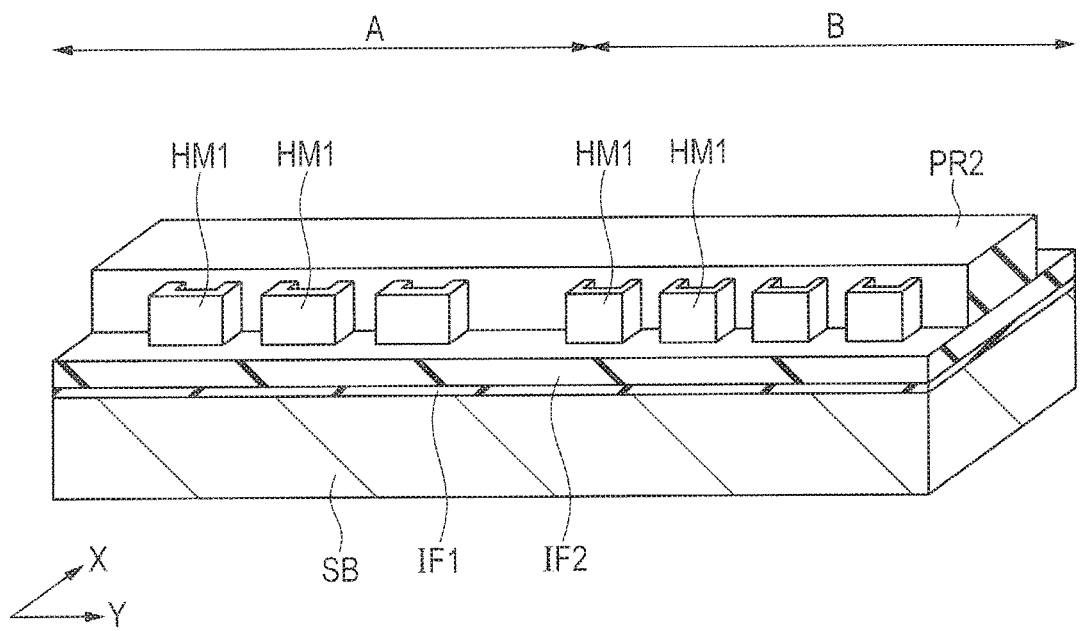
FIG. 11 is a perspective view for explaining a manufacturing process for the semiconductor device, after that of FIG. 9.

As illustrated in FIG. 11, a resist pattern PR2 covering a part of the hard mask HM1 is formed in each of the region A and the region B. The resist pattern PR2 is a pattern covering, of the hard mask HM1, a part extending in the direction "X", and for exposing the end part of the above part extending in the direction "X" and the part extending in the direction "Y". That is, both end parts of the hard mask HM1 in the direction "X" are exposed from the resist pattern PR2.

Figure 12:
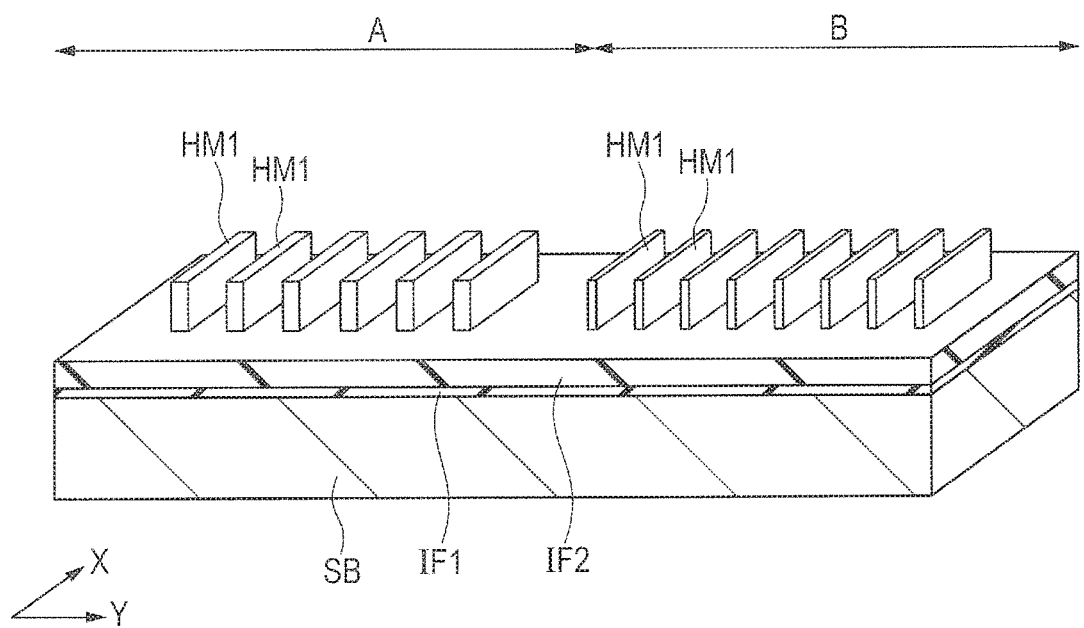
FIG. 12 is a perspective view for explaining a manufacturing process for the semiconductor device, after that of FIG. 11.
Figure 13:
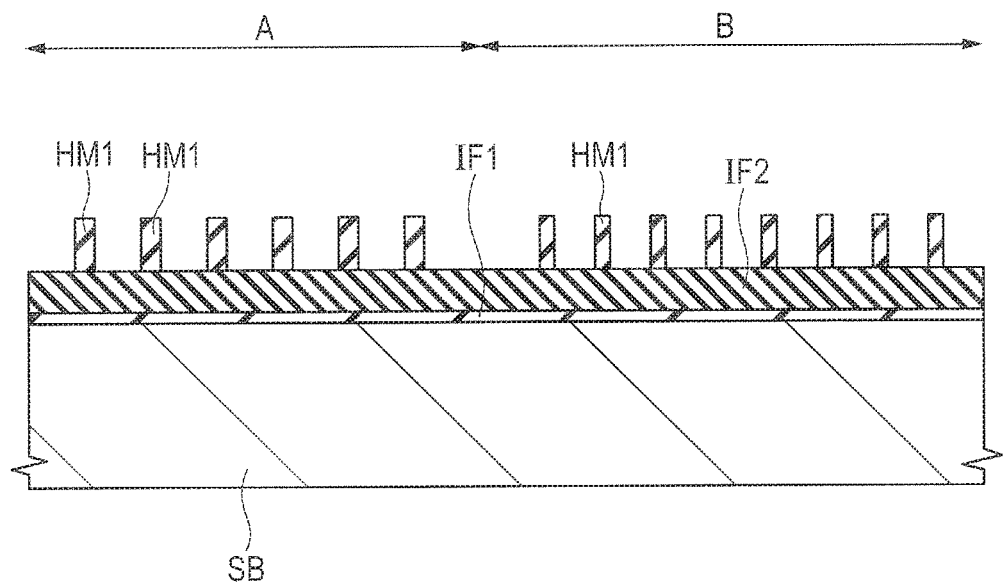
FIG. 13 is a cross sectional view along the direction "Y" of the semiconductor device in the manufacturing process illustrated in FIG. 12.

As illustrated in FIG. 12 and FIG. 13, the resist pattern PR2 is used as a mask, for performing the etching, thereby removing a part of each hard mask HM1. As a result of this, only a part of the hard mask HM1 extending in the direction X remains. That is, on the insulating film IF2, a plurality of hard masks HM1 as patterns extending in the direction "X" are arranged in the direction "Y".

After this, the resist pattern PR2 is removed using an asking process.

Figure 14:
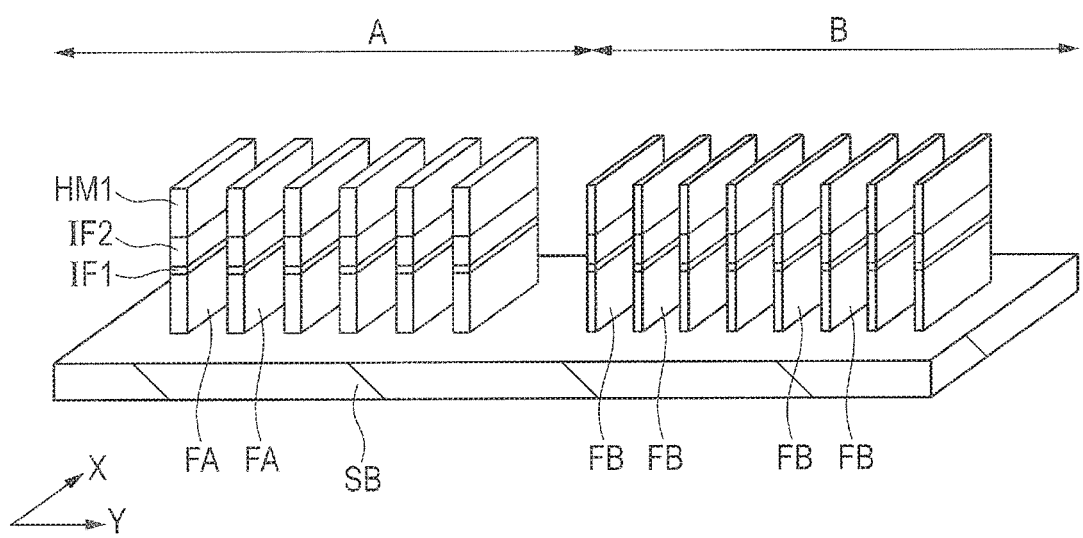
FIG. 14 is a perspective view for explaining a manufacturing process for the semiconductor device, after that of FIG. 12.
Figure 15:
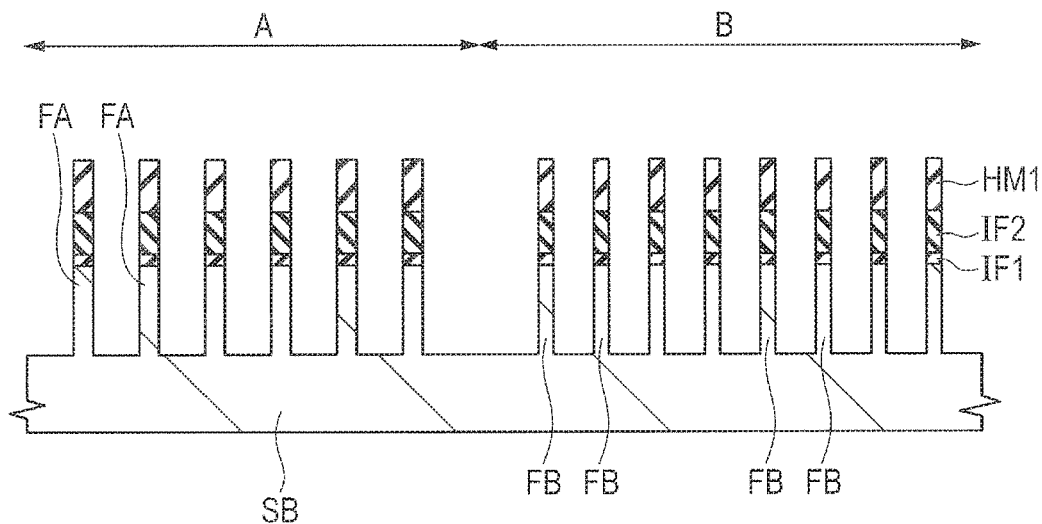
FIG. 15 is a cross sectional view along the direction "Y" of the semiconductor device in the manufacturing process illustrated in FIG. 14.

As illustrated in FIG. 14 and FIG. 15, anisotropic etching is performed for the insulating film IF2, the insulating film IF1, and the semiconductor substrate SB, with using the hard mask HM1 as a mask. As a result, there is formed a pattern (the fin FA and the fin FB) as a part of the semiconductor substrate SB which is processed in a plate-like form (wall-like form), right under the hard mask HM1. In this case, the main surface of the semiconductor substrate SB of the region exposed from the hard mask HM1 is dug from 100 to 250 nm, thereby forming the fin FA and the fin FB having a height of 100 to 250 nm from the main surface of the semiconductor substrate SB.

Figure 16:
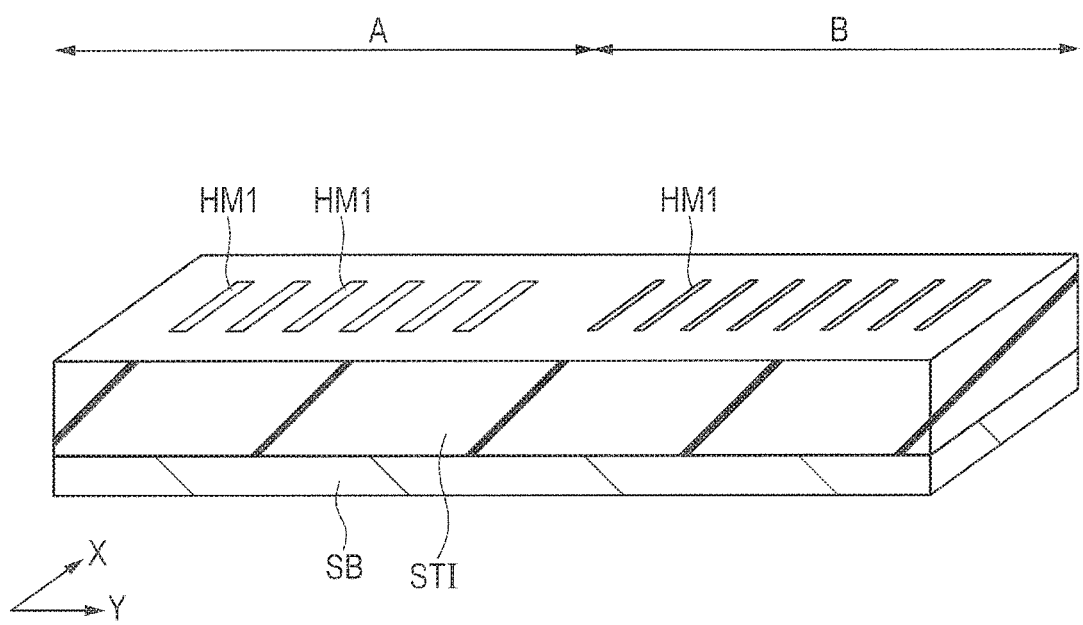
FIG. 16 is a perspective view for explaining a manufacturing process for the semiconductor device, after that of FIG. 14.
Figure 17:
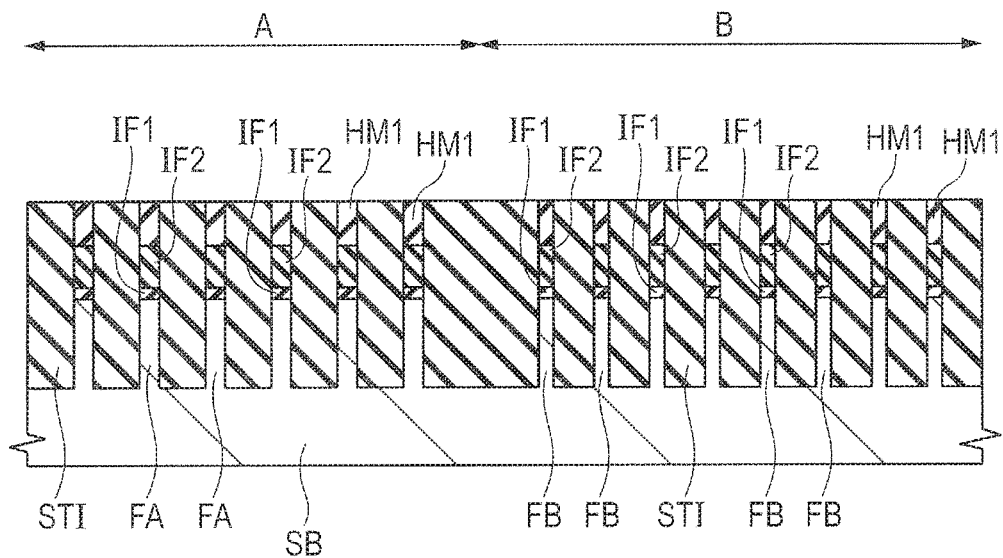
FIG. 17 is a cross sectional view along the direction "Y" of the semiconductor device in the manufacturing process illustrated in FIG. 16.

As illustrated in FIG. 16 and FIG. 17, an insulating film formed from a silicon oxide film is deposited on the semiconductor substrate SB, in a manner to fill between the fin FA, the fin FB, the insulating film IF1, the insulating film IF2, and the hard mask HM1. Subsequently, a polishing process is performed for this insulating film using a CMP (Chemical Mechanical Polishing) technique, for exposing the upper surface of the hard mask HM1. This results in forming the element isolation part STI formed from the above insulating film.

Figure 18:
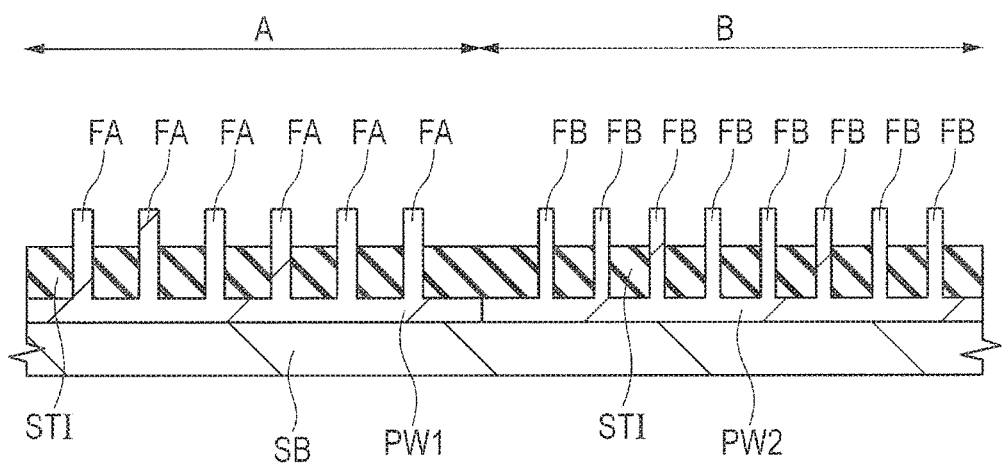
FIG. 18 is a cross sectional view for explaining a manufacturing process for the semiconductor device, after that of FIG. 17.

Now, as illustrated in FIG. 18, the hard mask HM1, the insulating film IF1, and the insulating film IF2 are removed. Subsequently, an etching process is performed for the upper surface of the element isolation part STI, thereby retreating the upper surface of the element isolation part STI in a height direction. As a result, a part and the upper surface of the side surface of the fin FA and the fin FB are exposed.

After this, using a photolithography technique and an ion implantation technique, impurities are introduced to the main surface of the semiconductor substrate SB, thereby forming the p-type well PW1 into the fin FA of the region A, and forming the p-type well PW2 in the fin FB of the region B. The impurities for forming the p-type well PW1 and the p-type well PW2 are, for example, boron (B) or boron difluoride ($BF_2$). Each of the wells spreads out and is formed entirely in each fin and in a part of the semiconductor substrate SB of the lower part of each fin.

As described above, the fin FA is formed in the region A, and the fin FB is formed in the region B.

Descriptions will now be made to the following manufacturing processes, using FIG. 19 to FIG. 33. The region 1A, the region 2A, the region 3A, and the region 1B illustrated in FIG. 19 to FIG. 33 correspond to those explained in FIG. 4, and are illustrated in cross sectional views, taken along lines A-A of FIG. 2, B-B of FIG. 2, C-C of FIG. 2, and D-D of FIG. 2.

Figure 19:
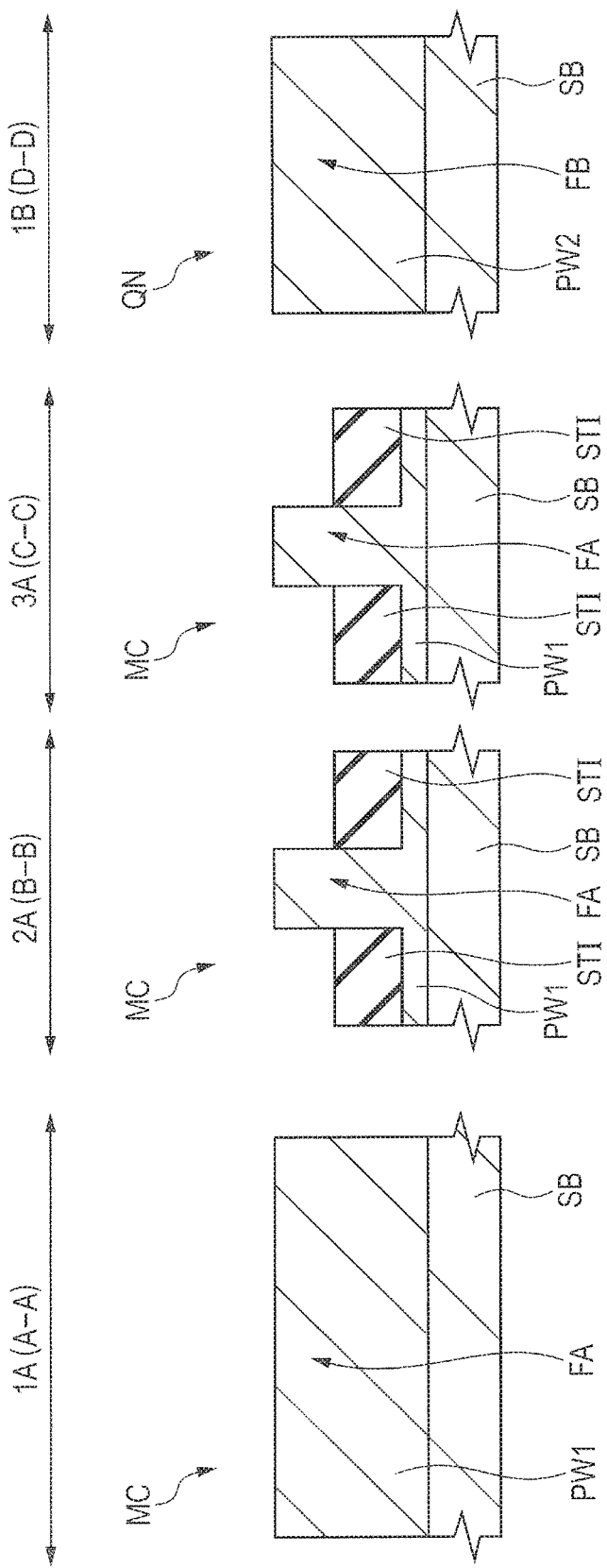
FIG. 19 is a cross sectional view for explaining a manufacturing process for the semiconductor device, after that of FIG. 17.

FIG. 19 illustrates a manufacturing process after that of FIG. 17, and illustrates states of the region 1A, the region 2A, the region 3A, and the region 1B, when the manufacturing process of FIG. 18 is completed.

Figure 20:
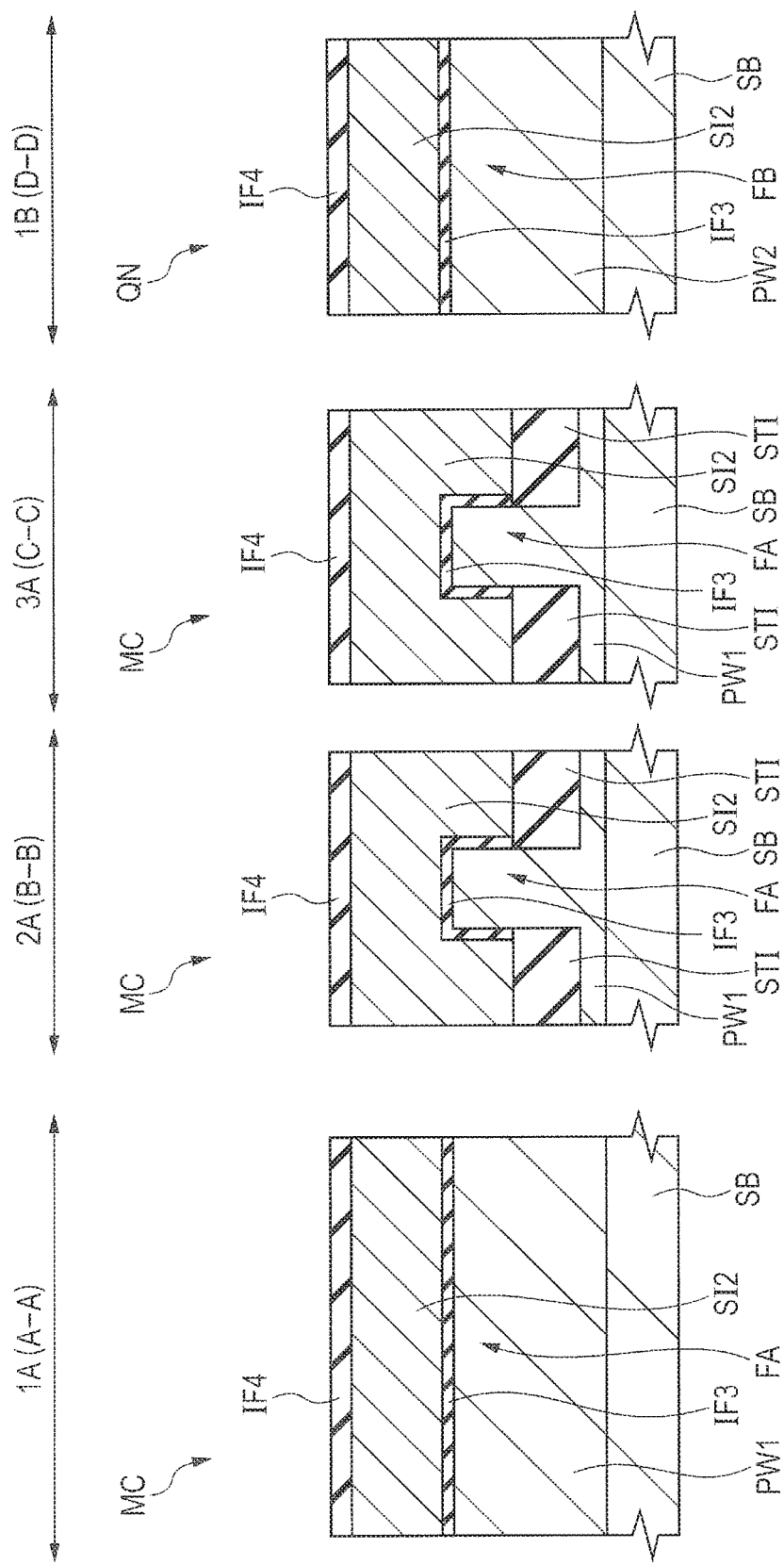
FIG. 20 is a cross sectional view for explaining a manufacturing process for the semiconductor device, after that of FIG. 19.

FIG. 20 illustrates a formation process for an insulating film IF3, a conductive film SI2, and an insulating film IF4. First, there is formed the insulating film IF3 covering the upper surface and the side surface of the fin FA and the fin FB. The insulating film IF3 is a silicon oxide film which has been formed using, for example, a thermal oxidation technique, and has a thickness of approximately 2 nm. Subsequently, using, for example, the CVD technique, a conductive film SI2 is deposited on the insulating film IF3. After this, using, for example, the CMP technique, the upper surface of the conductive film SI2 is planarized, thereby forming the conductive film SI2 having the planar upper surface. Then, on the conductive film SI2, using, for example, the CVD technique, the insulating film IF4 is formed. The conductive film SI2 is formed from, for example, a polycrystalline silicon film, and the insulating film IF4 is formed from, for example, a silicon nitride film. As described above, even after a polishing process is performed for the conductive film using the CMP technique, the conductive film SI2 still remains on the upper surface of the fin FA and the upper surface of the fin FB.

Figure 21:
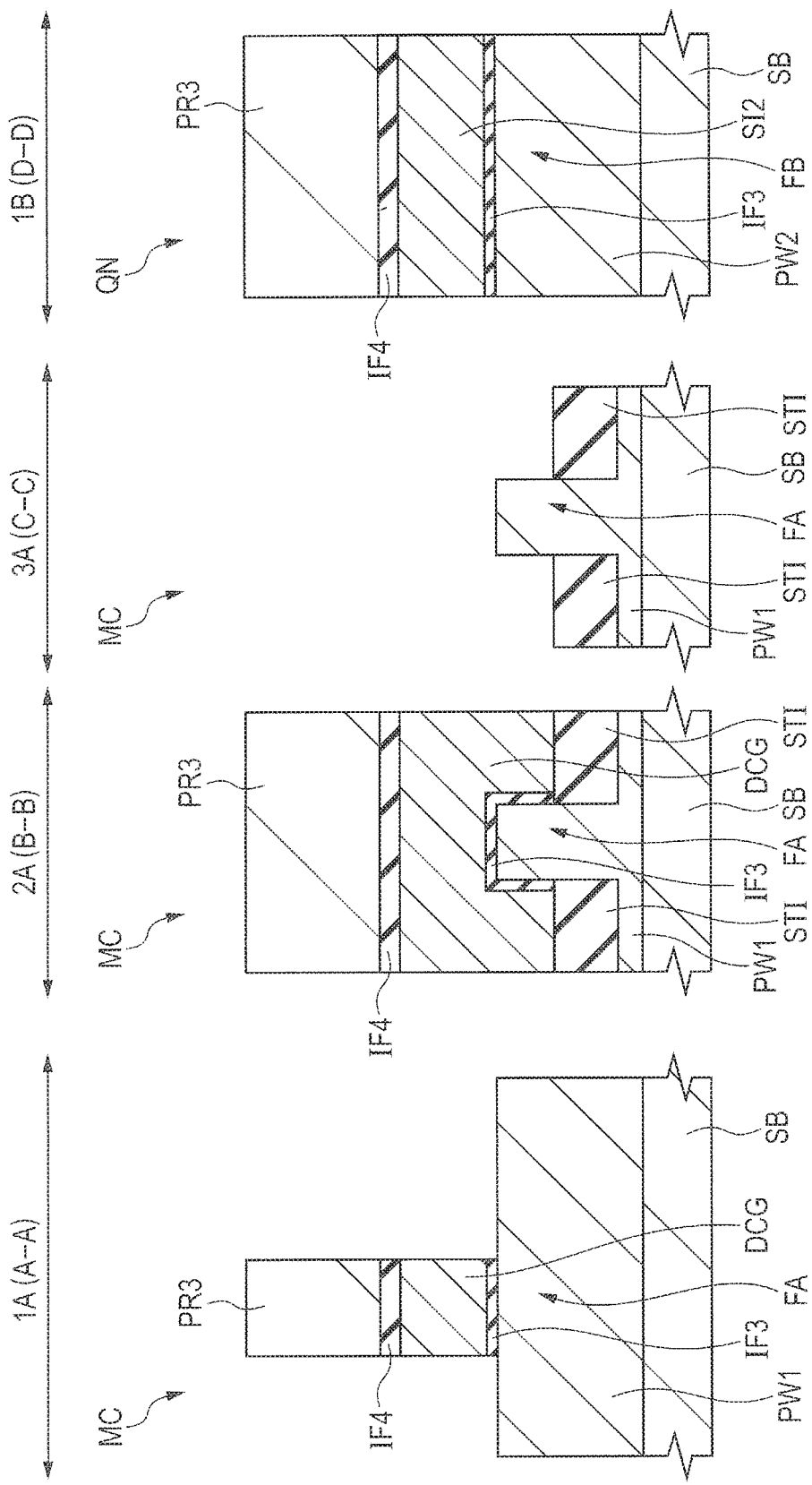
FIG. 21 is a cross sectional view for explaining a manufacturing process for the semiconductor device, after that of FIG. 20.

FIG. 21 illustrates a formation process for the control gate electrode CG. On the insulating film IF4, there is selectively formed a resist pattern PR3. This pattern PR3 covers a formation region of the control gate electrode CG in the region 1A and the region 2A, covers the entire region 1B, and has a pattern for exposing the region 3A. Dry etching is performed using this resist pattern PR3, thereby patterning the insulating film IF4. Subsequently, dry etching is performed for the conductive film SI2, thereby forming a dummy gate electrode DCG. After this, the insulating film IF3 exposed from the dummy gate electrode DCG is removed. At this time, in the region 3A, the insulating film IF4, the conductive film SI2, and the insulating film IF3 are removed. As a result, the upper surface and the side surface of the fin A and the upper surface of the element isolation part STI are exposed.

After this, an asking process is performed, thereby removing the resist pattern PR3.

Figure 22:
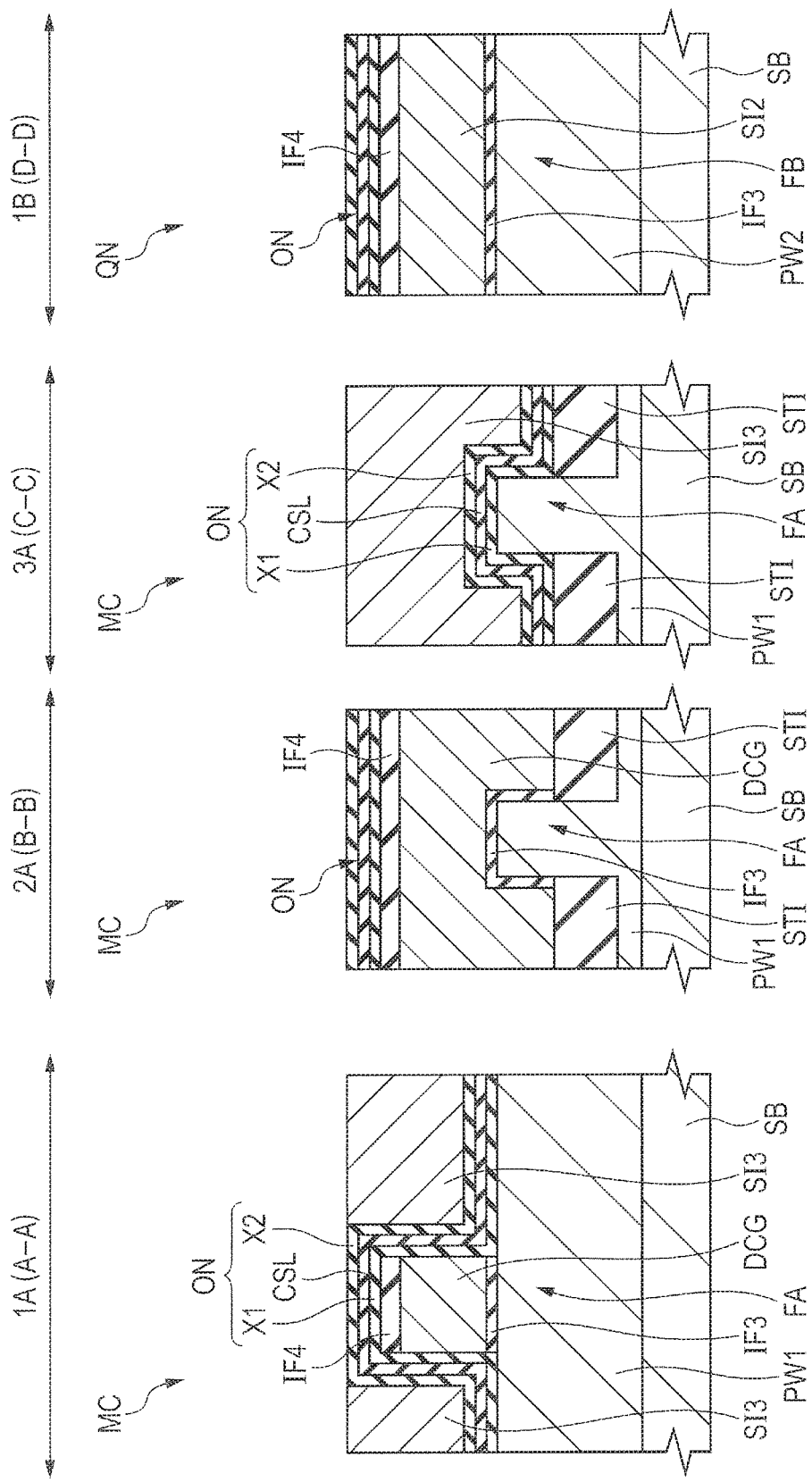
FIG. 22 is a cross sectional view for explaining a manufacturing process for the semiconductor device, after that of FIG. 21.

FIG. 22 illustrates a formation process for the insulating film ON and a conductive film S13. The insulating film ON is formed from a laminated film of the insulating film X1, the charge storage layer CSL, and the insulating film X2. Using, for example, a thermal oxidation technique, the insulating film X1 is formed on the upper surface and the side surface of the fin FA exposed from the dummy gate electrode DCG. The insulating film X1 is, for example, a silicon oxide film, and has a thickness of 4 nm. Using, for example, the CVD technique, the charge storage layer CSL is formed on the insulating film X1. The charge storage layer CSL is a trap insulating film which can hold charges, and is, for example, a silicon nitride film having a thickness of 7 nm. Using, for example, the CVD technique, the insulating film X2 is formed on the charge storage layer CSL. The insulating film X2 is, for example, a silicon oxide film or a silicon oxynitride film, and has a thickness of 9 nm. The charge storage layer CSL may be formed using a film including a metal oxide film which is formed by nitriding hafnium or aluminum, instead of a silicon nitride film.

As shown in the region 1A, in the long-side direction (direction "X") of the fin FA, the insulating film ON is formed on the upper surface of the fin FA, on the side surface of the dummy gate electrode DCG, and on the side surface of the insulating film IF4. That is, the insulating film ON is formed in an L-like shape, in the long-side direction (direction "X") of the fin FA. As shown in the region 3A, the insulating film ON is formed on the upper surface and the side surface of the fin FA and the upper surface of the element isolation part STI, in the short-side direction (direction "Y") of the fin FA.

Next, for example, using the CVD technique, the conductive film S13 is deposited on the insulating film ON. The conductive film S13 is formed from, for example, a polycrystalline silicon film. After this, the CMP process is performed for this conductive film S13, thereby causing the insulating film ON on the dummy gate electrode DCG to be exposed. That is, the conductive film S13 is polished, with using the insulating film ON as a stopper. As a result, as shown in the region 1A and the region 3A, the conductive film S13 is selectively formed in a region adjacent to the dummy gate electrode DCG. Note that, in the region IB, the conductive film S13 is removed, thus resulting in exposing the insulating film ON.

Figure 23:
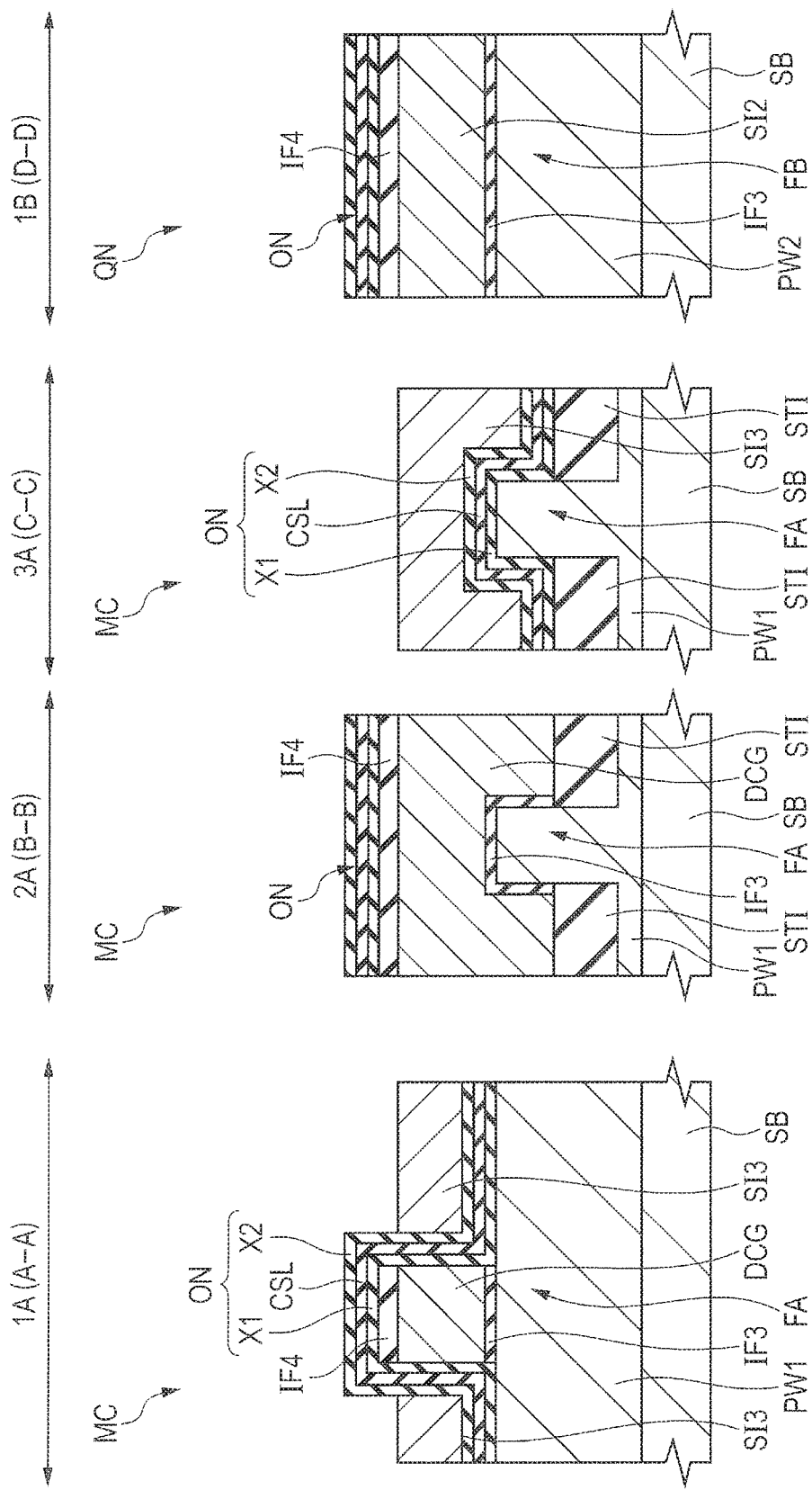
FIG. 23 is a cross sectional view for explaining a manufacturing process for the semiconductor device, after that of FIG. 22.

FIG. 23 illustrates a process for retreating the upper surface of the conductive film S13. As shown in the region 1A and the region 3A, the dry etching process or the wet etching process is performed for the conductive film S13, thereby lowering the height of the upper surface of the conductive film S13. In the region 2A and the region 1B, the insulating film ON functions as an etching stopper. After this etching process, the height of the upper surface of the conductive film S13 is approximately equal to the height of the upper surface of the dummy gate electrode DCG.

Figure 24:
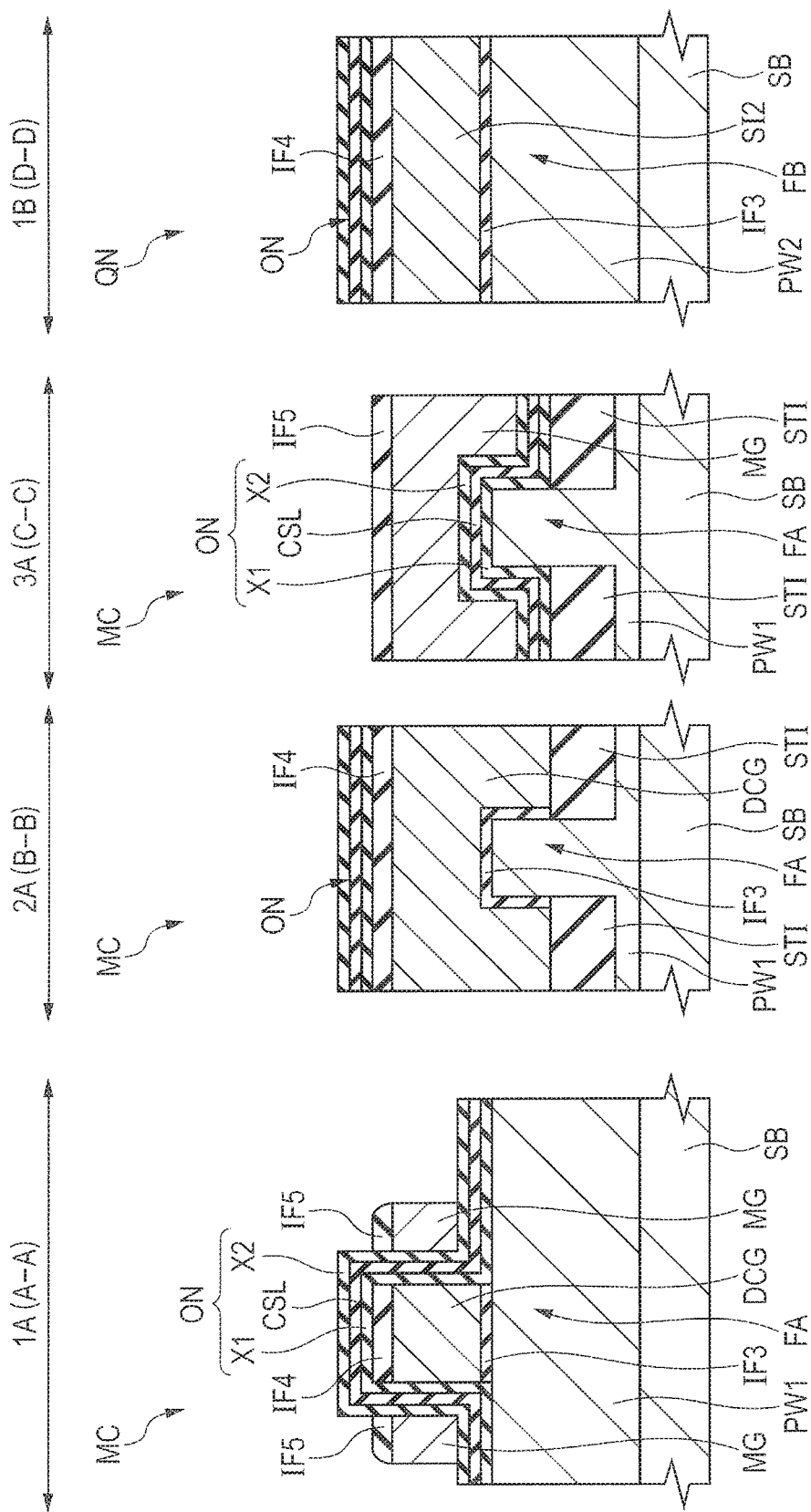
FIG. 24 is a cross sectional view for explaining a manufacturing process for the semiconductor device, after that of FIG. 23.

FIG. 24 illustrates a formation process for an insulating film IF5 and the memory gate electrode MG. First, there is formed the insulating film IF5 which is formed from, for example, a silicon nitride film on the conductive film S13 retreated in FIG. 3, using the CVD technique. After this, by performing anisotropic dry etching, the insulating film IF5 is processed in a sidewall spacer form in a manner that the insulating film IF5 remains on the conductive film S13 formed in the region 1A. At this time, the insulating film IF5 of the region 2A and the region 1B is removed. By performing anisotropic dry etching with using this insulating film IF5 as a mask, the conductive film S13 exposed from the insulating film IF5 is removed. As a result, the memory gate electrode MG is formed on both side surfaces of the dummy gate electrode DCG through the insulating film ON.

Figure 25:
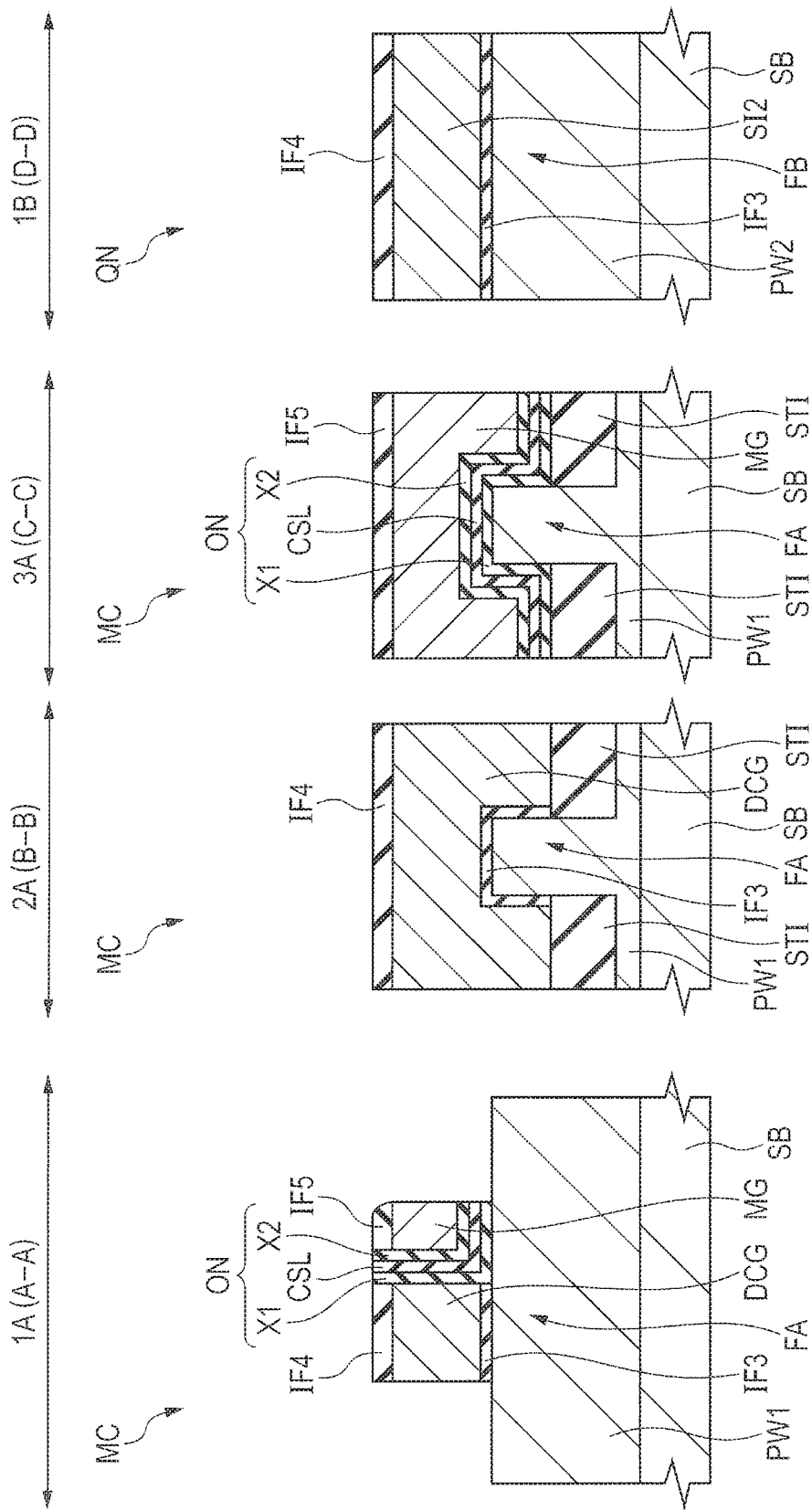
FIG. 25 is a cross sectional view for explaining a manufacturing process for the semiconductor device, after that of FIG. 24.

FIG. 25 illustrates a process for removing one of the memory gate electrodes MG formed on both side surfaces of the dummy gate electrodes DCG. First, there is formed a resist pattern (not illustrated) which covers the memory gate electrode MG formed on one side surface of the dummy gate electrode DCG. Next, dry etching and wet etching are performed with using this resist pattern as a mask, thereby removing the insulating film IF5 and the memory gate electrode MG which are not covered by the resist pattern. As a result, the memory gate electrode MG remains only on the side of the source region of the memory cell MC. The insulating film ON in a region exposed from the memory gate electrode MG is removed by the dry etching and the wet etching. As shown in the region 1A and the region 3A, the insulating film ON selectively remains between the memory gate electrode MG and the fin FA and also between the memory gate electrode MG and the dummy gate electrode DCG. The insulating film ON formed in the region 2A and the region 1B is removed by this process.

Figure 26:
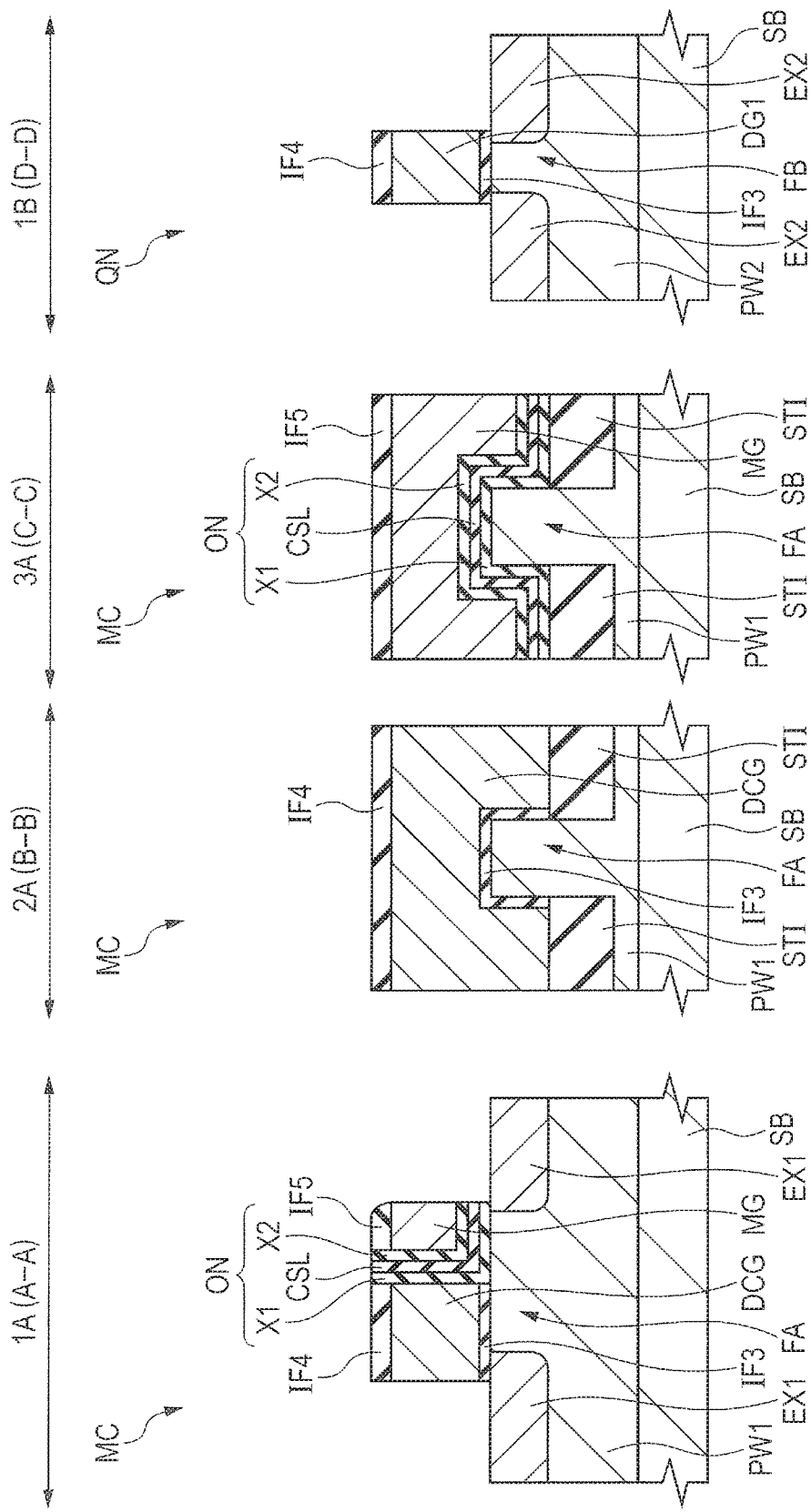
FIG. 26 is a cross sectional view for explaining a manufacturing process for the semiconductor device, after that of FIG. 25.

FIG. 26 illustrates a formation process for a dummy gate electrode DG1, the extension region EX1, and the extension region EX2. In the region 1B, the insulating film IF4 and the conductive film SI2 are patterned using a photolithography technique and a dry etching technique, thereby forming the dummy gate electrode DG1. After this, the insulating film IF3 exposed from the dummy gate electrode DG1 is removed.

For example, arsenic (As) or phosphorus (P) is introduced into the fin FA and the fin FB using the ion implantation technique, thereby forming the n-type extension region EX1 (semiconductor region EX1) in the fin FA and forming the n-type extension region EX2 (semiconductor region EX2) in the fin FB.

The extension region EX1 is formed by self-matching with the dummy gate electrode DCG and the memory gate electrode MG. That is, n-type impurities are implanted to the upper surface and the side surface of the fin FA exposed from the dummy gate electrode DCG and the memory gate electrode MG. Thus, the extension region EX1 is formed on both sides of the dummy gate electrode DCG and the memory gate electrode MG in a manner that the dummy gate electrode DCG and the memory gate electrode MG are sandwiched therebetween. Because impurities are diffused by the thermal process after ion implantation, the extension region EX1 partially overlaps in plan view with the dummy gate electrode DCG and the memory gate electrode MG.

The extension region EX2 is formed by self-matching with the dummy gate electrode DG1. That is, the n-type impurities are implanted to the upper surface and the side surface of the fin FB exposed from the dummy gate electrode DG1. Thus, the extension region EX2 is formed on both sides of the dummy gate electrode DG1 in a manner that the dummy gate electrode DG1 is sandwiched therebetween. Because the impurities are diffused by the thermal process after ion implantation, the extension region EX2 partially overlaps in plan view with the dummy gate electrode DG1.

Figure 27:
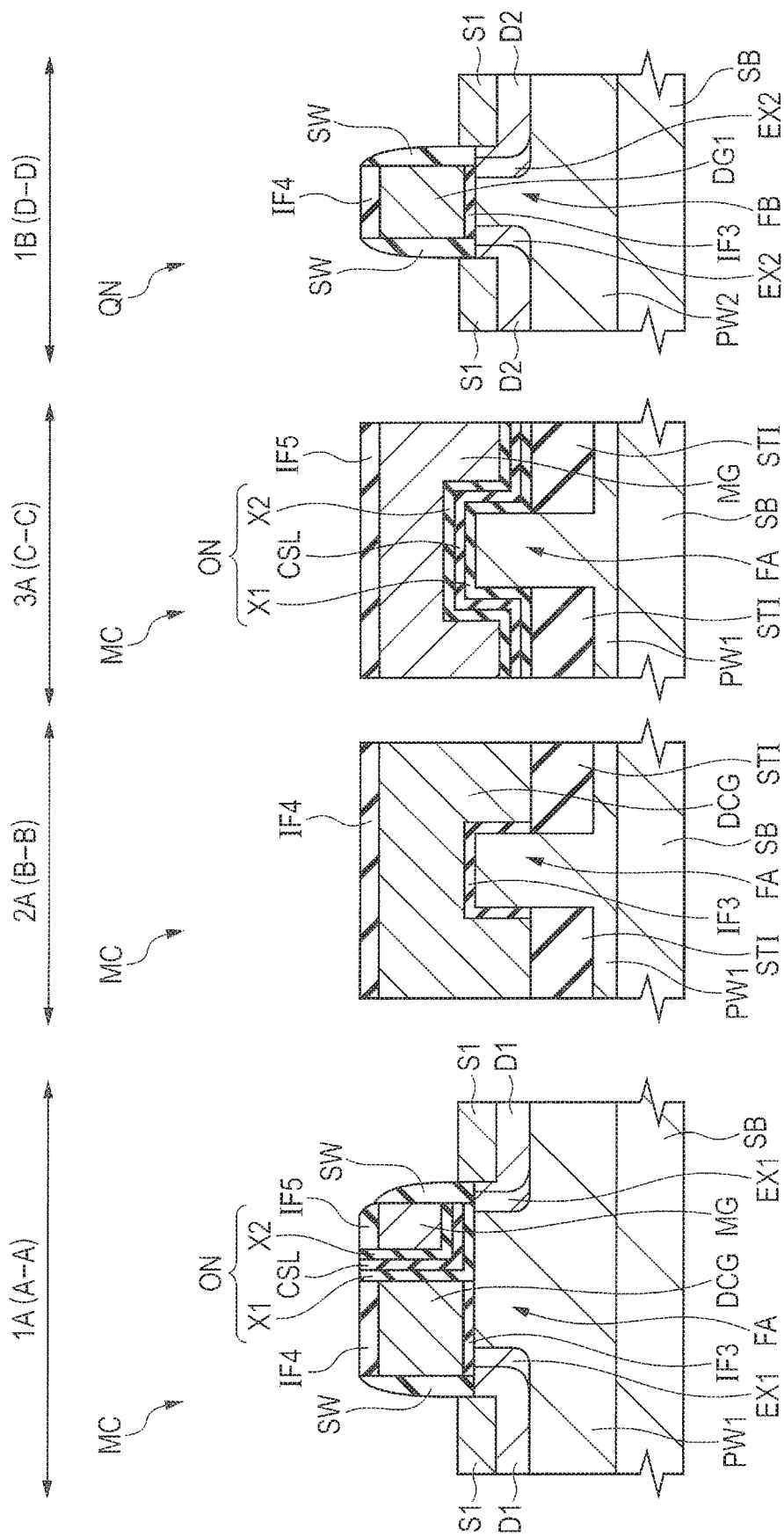
FIG. 27 is a cross sectional view for explaining a manufacturing process for the semiconductor device, after that of FIG. 26.

FIG. 27 illustrates a formation process for the sidewall spacer SW, the n-type diffusion region D1 (semiconductor region D1), the n-type diffusion region D2 (semiconductor region D2), and the silicide layer S1. After an insulating film formed from, for example, a silicon nitride film is deposited on the fin FA and the fin FB using the CVD technique, anisotropic dry etching is performed for the insulating film. In this manner, as shown in the region 1A, the sidewall spacer SW is formed on the side surface of the dummy gate electrode DCG and the insulating film IF4 and the side surface of the memory gate electrode MG and the insulating film IF5. As shown in the region 1B, the sidewall spacer SW is formed on the side surface of the dummy gate electrode DG1 and the insulating film IF4. By the above-described anisotropic dry etching, in the region 2A and the region 3A, the insulating film for forming the sidewall spacer SW is removed, thus causing the insulating film IF4 and the insulating film IF5 to be exposed. The sidewall spacer SW may be a laminated film of a silicon oxide film and a silicon nitride film.

Next, using the ion implantation technique, for example, arsenic (As) or phosphorus (P) is introduced into the fin FA and the fin FB beside the sidewall spacer SW, thereby forming the n-type diffusion region D1 and the n-type diffusion region D2. The diffusion region D1 has an impurity concentration greater than that of the extension region EX1, while the diffusion region D2 has an impurity concentration greater than that of the extension region EX2.

In this manner, in the memory cell MC, the diffusion region D1 and the extension region EX1 which function as a part of the drain region MD and the source region MS are formed. In the n-type transistor QN, the diffusion region D2 and the extension region EX2 which function as a part of the drain region LD and the source region LS are formed.

Next, as shown in the region 1A and the region 1B, the silicide layer S1 formed from, for example, nickel silicide (NiSi) is formed on the diffusion region D1 of the source region MS, the diffusion region D1 of the drain region MD, the diffusion region D2 of the source region LS, and the diffusion region D2 of the drain region LD. Platinum (Pt) may be added to the silicide layer S1. According to the formation method for the silicide layer S1, a nickel layer is formed on the semiconductor substrate SB, and the thermal process is performed. By doing this, the nickel film reacts with silicon of the diffusion region D1 and the diffusion region D2, thereby forming a $Ni_2Si$ film. After this, an unreacted metal film is removed by wet etching, and a thermal process is performed again, thereby forming a NiSi film.

Figure 28:
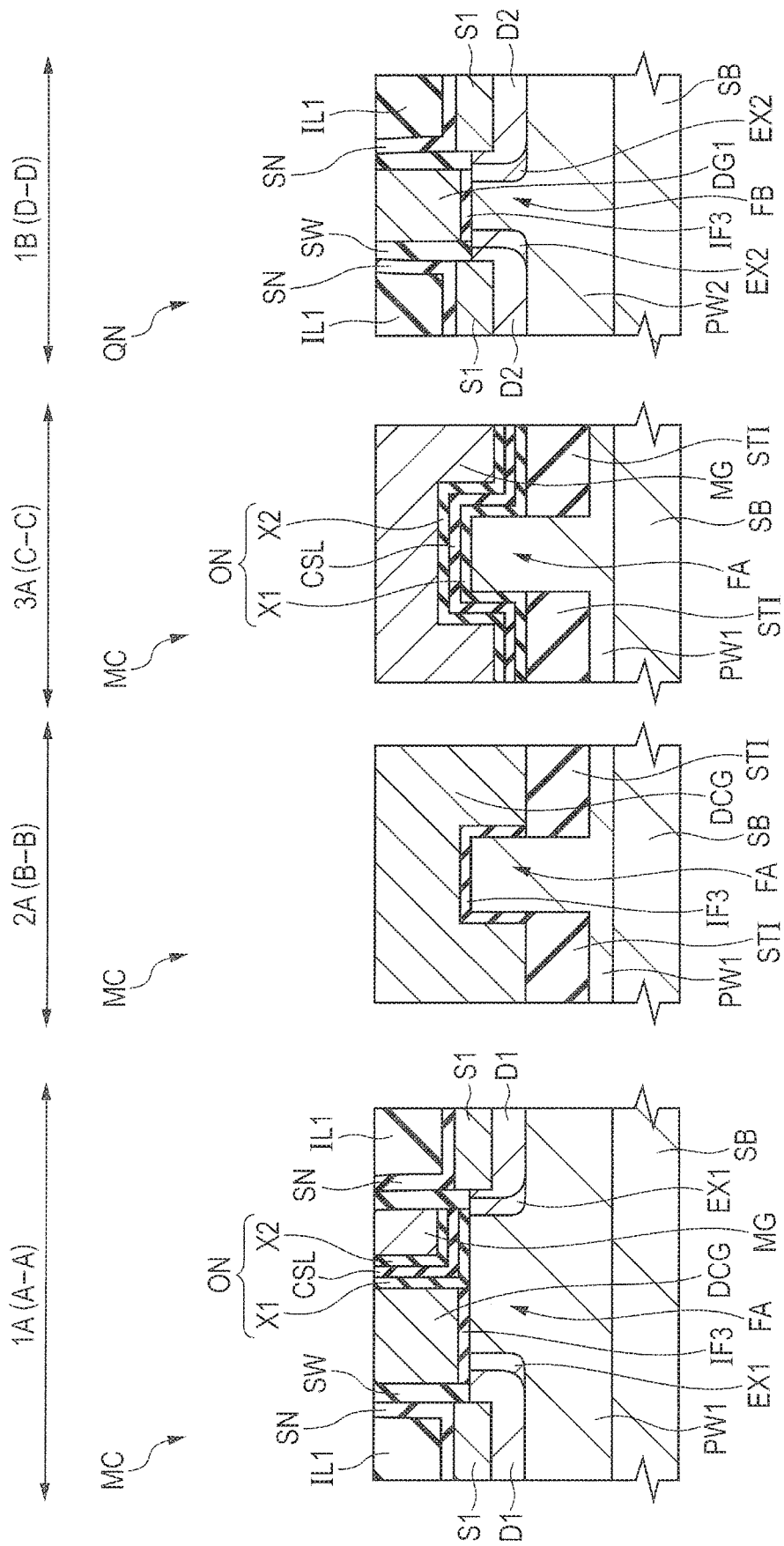
FIG. 28 is a cross sectional view for explaining a manufacturing process for the semiconductor device, after that of FIG. 27.

FIG. 28 illustrates a formation process for the insulating film SN and the interlayer insulating film ILL Using the CVD technique, the insulating film SN formed of, for example, a silicon nitride film is formed on the semiconductor substrate SB, in a manner to cover the dummy gate electrode DCG, the memory gate electrode MG, and the dummy gate electrode DG1. Subsequently, using the CVD technique, the interlayer insulating film IL1 formed from, for example, a silicon oxide film is formed on the insulating film SN. Using the CMP method, the insulating film SN and the interlayer insulating film IL1 are polished. This polishing process causes removal of the interlayer insulating film IL1, the insulating film SN, the insulating film IF4, and the insulating film IF5 which are formed on the dummy gate electrode DCG, the memory gate electrode MG, and the dummy gate electrode DG1. In this manner, the upper surfaces of the dummy gate electrode DCG, the memory gate electrode MG, and the dummy gate electrode DG1 are exposed.

The insulating film SN and the interlayer insulating film IL1 remain on the diffusion region D1 and the diffusion region D2 beside the sidewall spacer SW.

Figure 29:
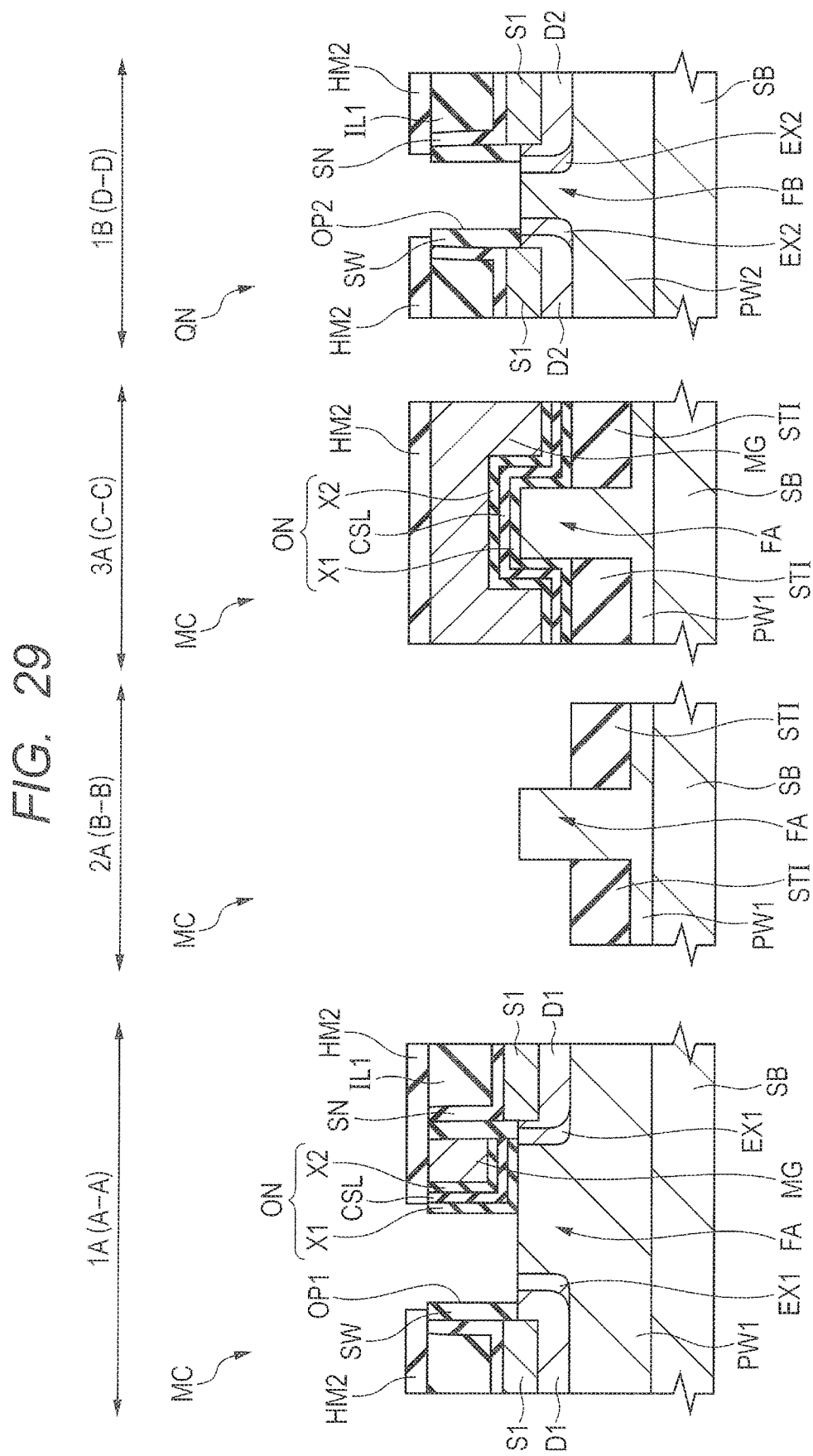
FIG. 29 is a cross sectional view for explaining a manufacturing process for the semiconductor device, after that of FIG. 28.

FIG. 29 illustrates a removal process for the dummy gate electrode DCG and the dummy gate electrode DG1. There is formed a hard mask HM2 having a pattern opening the area for removing the dummy gate electrode DCG and the dummy gate electrode DG1. The hard mask HM2 is formed from, for example, an insulating film like a silicon oxide film, or a metal film like a titanium nitride film. Using the dry etching technique and the wet etching technique, the dummy gate electrode DCG and the dummy gate electrode DG1 exposed from the hard mask HM2 are removed, and the insulating film IF3 formed below the dummy gate electrode DCG and the dummy gate electrode DG1 is also removed. As a result, in the region 1A, the opening OP1 for exposing at least the fin FA is formed between the sidewall spacer SW and the insulating film ON. In the region 1B, the opening OP2 for exposing at least the fin FB is formed between two sidewall spacers SW.

Figure 30:
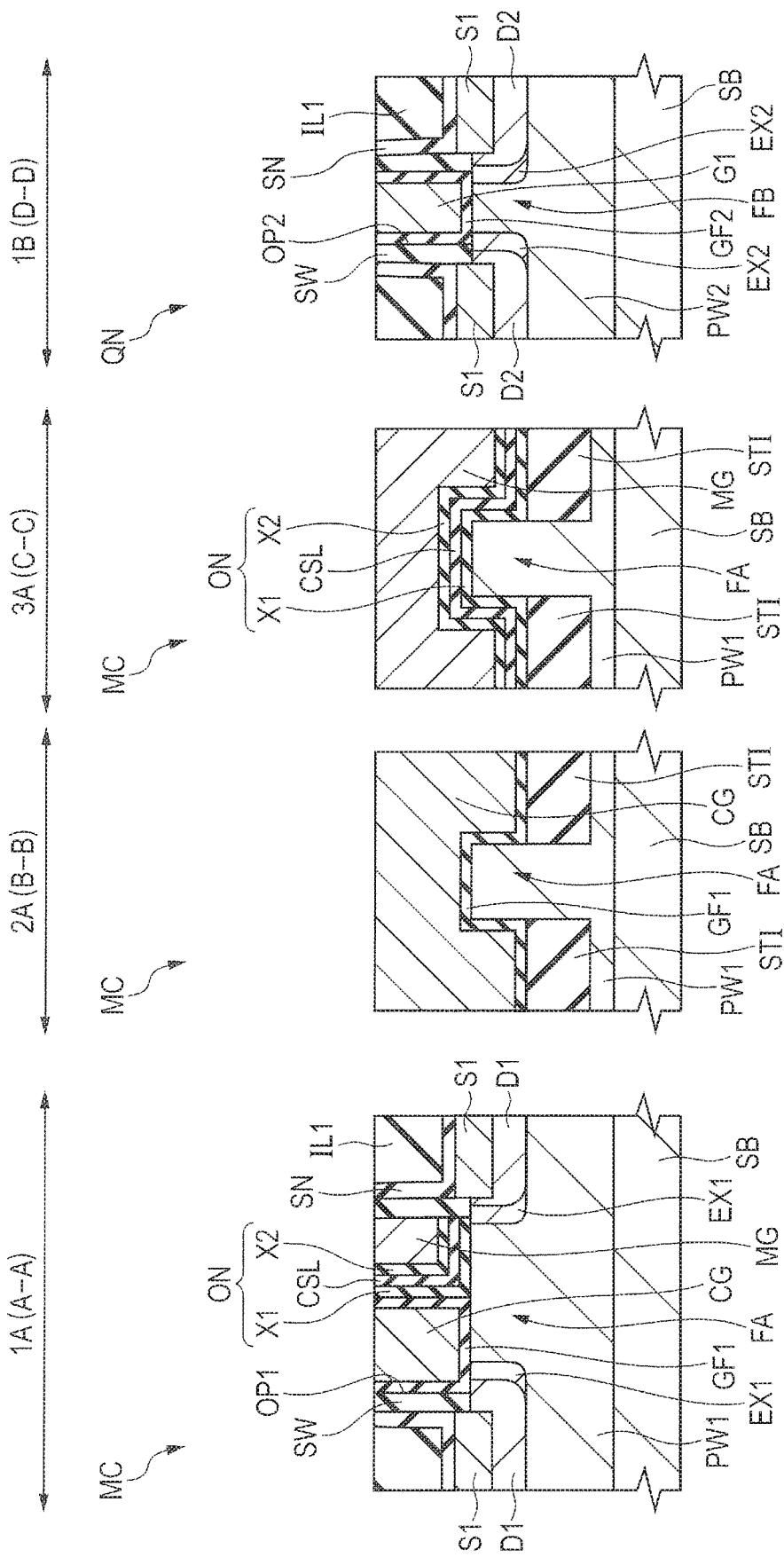
FIG. 30 is a cross sectional view for explaining a manufacturing process for the semiconductor device, after that of FIG. 29.

FIG. 30 illustrates a formation process for the gate insulating film GF1, the gate insulating film GF2, the control gate electrode CG, and the gate electrode G1. In the region 1A, a high dielectric constant film is formed along the side surface and the bottom surface of the opening OP1. At this time, in the region 1B, a high dielectric constant film is formed along the side surface and the bottom surface in the opening OP2. Next, a metal film is formed and embedded in the opening OP1 and the opening OP2, through the high dielectric constant film. After this, polishing and removal are performed for the metal film, the dielectric film, and the hard mask, formed outside the opening OP1 and outside the opening OP2, using the CMP technique. As a result of this, in the opening OP1, there are formed the gate insulating film GF1 formed from the above-described high dielectric constant film and the control gate electrode CG formed from the above-described metal film. In addition, in the opening OP2, there are formed the gate insulating film GF2 formed from the above-described high dielectric constant film and the gate electrode G1 formed from the above-described metal film.

The above-described high dielectric constant film is formed using the CVD technique or an ALD (Atomic Layer Deposition) method, and is formed from an insulating material film having a dielectric constant greater than that of silicon oxide. This high dielectric constant film is a metal oxide film formed from, for example, an oxide film including hafnium, an oxide film including aluminum, an oxide film including zirconium, or an oxide film including tantalum. The high dielectric constant film has a thickness of, for example, 1 to 2 nm.

Before the formation of the above-described high dielectric constant film, the semiconductor substrate SB is thermally oxidized. By doing this, a silicon oxide film with a thickness of 1 nm may be formed between the high dielectric constant film and the fin FA and between the high dielectric constant film and the fin FB. In this case, this silicon oxide film serves as a part of the gate insulating film GF1 and a part of the gate insulating film GF1.

The above-described metal film is formed using the CVD technique or a sputtering method, and is formed from a single layered metal film including, for example, a tantalum nitride film, a titanium aluminum film, a titanium nitride film, a tungsten film, or an aluminum film, or a laminated film in which any of these films are appropriately laminated.

Figure 31:
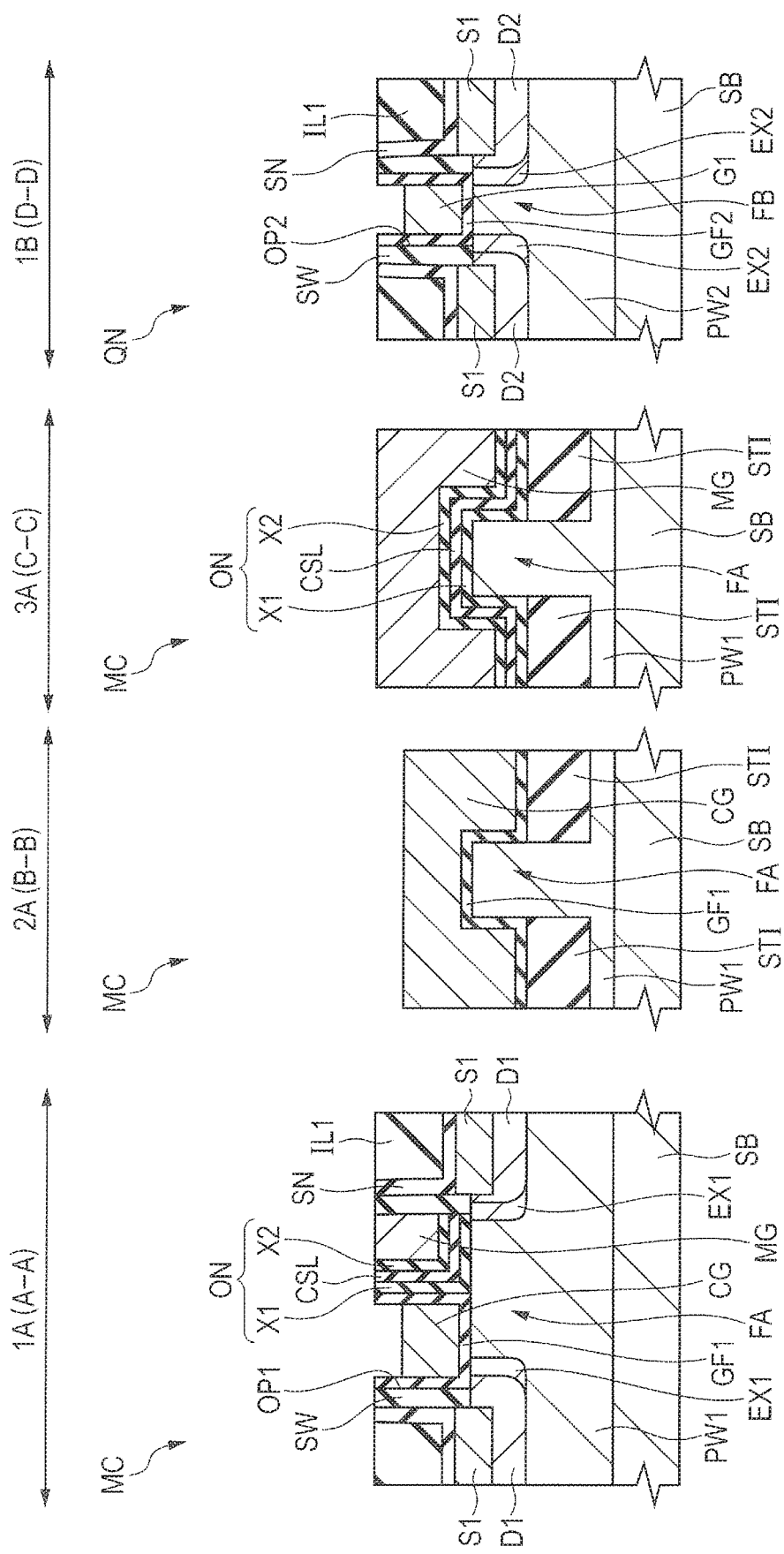
FIG. 31 is a cross sectional view for explaining a manufacturing process for the semiconductor device, after that that of FIG. 30.

FIG. 31 illustrates a process for retreating the upper surface of the control gate electrode CG and the upper surface of the gate electrode G1. As shown in the region 1A, in the region 2A, and in the region 1B, the upper surface of the control gate electrode CG and the upper surface of the gate electrode G1 are retreated. At this time, the gate insulating film GF1 and the gate insulating film GF2 are made to remain on the side surface of the opening OP1 and the side surface of the opening OP2. That is, the upper surface of the control gate electrode CG and the upper surface of the gate electrode G1 are etched under a condition of a sufficiently high selective ratio to the gate insulating film GF and the gate insulating film GF2.

Figure 32:
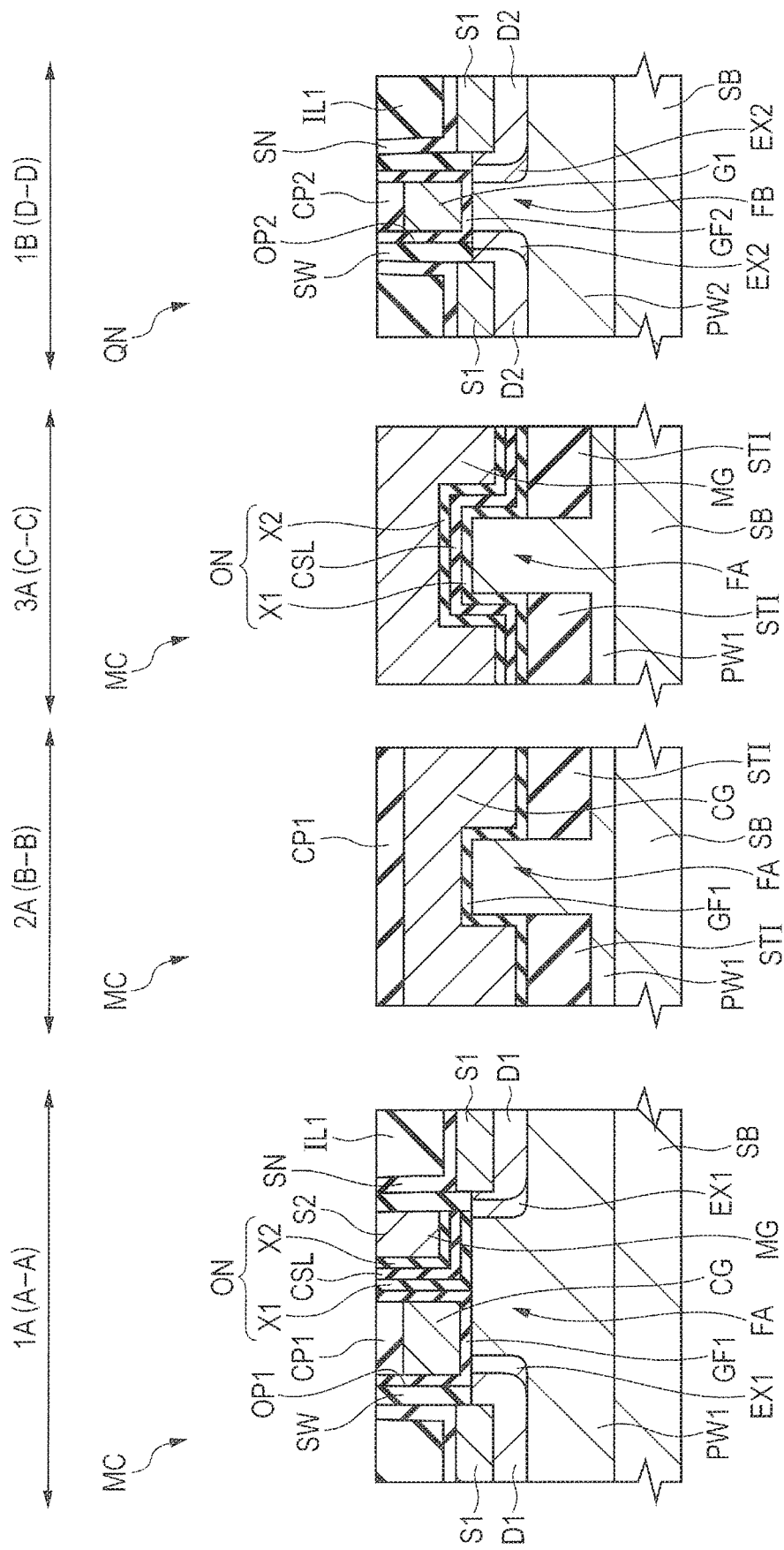
FIG. 32 is a cross sectional view for explaining a manufacturing process for the semiconductor device, after that of FIG. 31.

FIG. 32 illustrates a formation process for the cap film CP1 and the cap film CP2. First, an insulating film formed from, for example, a silicon nitride film is formed on the semiconductor substrate SB, using the CVD technique. After this, this insulating film is polished using the CMP method, thereby removing the insulating film outside the opening OP1 and outside the opening OP2 and forming the cap film CP1 and the cap film CP2 formed from the insulating film inside the opening OP1 and inside the opening OP2. That is, the cap film CP1 and the cap film CP2 are formed respectively on the retreated upper surface of the control gate electrode CG and the retreated upper surface of the gate electrode G1.

As shown in the region 1A, the gate insulating film GF1 and the insulating film ON exist between the cap film CP1 and the memory gate electrode MG.

As will be described later, the cap film CP1 is formed for the sake of preventing that the contact hole CH reaches the control gate electrode CG, when the contact hole CH for the drain region MD is formed in the interlayer insulating film IL2. Thus, in consideration of the selection ratio of etching at the formation of the contact hole CH, it is preferred that the material of the cap film CP1 differs from those of the interlayer insulating film IL2.

Figure 33:
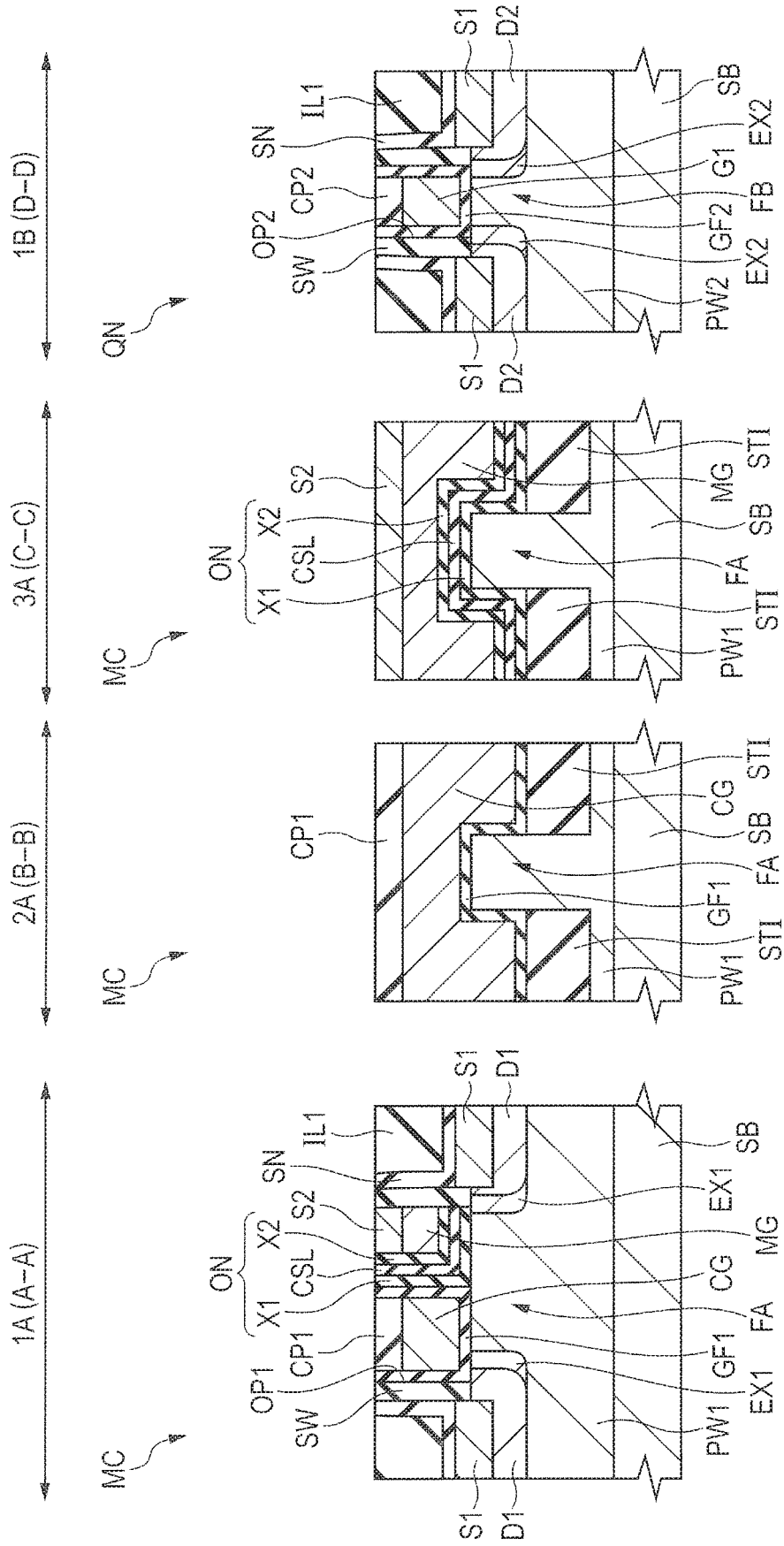
FIG. 33 is a cross sectional view for explaining a manufacturing process for the semiconductor device, after that of FIG. 32.

FIG. 33 illustrates a formation process for the silicide layer S2. The silicide layer S2 is formed from, for example, nickel silicide (NiSi) or cobalt silicide (CoSi$_2$), on the upper surface of the memory gate electrode MG. Platinum (Pt) may be added to the silicide layer S2. According to the formation method for the silicide layer S2, a metal film is formed on the semiconductor substrate SB, and a thermal process is performed therefor. As a result of this, the metal film reacts with polycrystalline silicon of the memory gate electrode MG. After this, an unreacted metal film is removed by wet etching, and a thermal process is performed again, thereby forming a silicide layer S2.

In this embodiment, it is not necessary to form the silicide layer S2. However, when it is required to lower the resistance of the memory gate electrode MG, the silicide layer S2 is preferably formed on the memory gate electrode MG.

After this, as illustrated in FIG. 4, there are formed the interlayer insulating film IL2, the plugs PG1 to PG3, the interlayer insulating film IL3, and the wiring M1. First, the interlayer insulating film IL2 formed from, for example, a silicon oxide film is formed, to cover the interlayer insulating film IL1, the memory cell MC, and the n-type transistor QN, using, for example, the CVD technique. After this, a contact hole is formed in the interlayer insulating film IL2, the interlayer insulating IL1, and the insulating film SN, using the photolithography technique and the dry etching technique. Then, the plugs PG1 to PG3 are formed in the contact hole. The plug PG1 is electrically coupled to the drain region MD of the memory cell MC, the plug PG2 is electrically coupled to the source region MS of the memory cell MC, and the plug PG3 is electrically coupled to the drain region LD and the source region LS of the n-type transistor QN. The plugs PG1 to PG3 are formed from, for example, a barrier metal film including a titanium film, a titanium nitride film, or a laminated film thereof, and a conductive film mainly including tungsten (W).

Next, the interlayer insulating film IL3 mainly including, for example, a silicon oxide film is formed on the interlayer insulating film IL2, using, for example, the CVD technique.

A trench for wiring is formed in the interlayer insulating film IL3. In this trench for wiring, a conductive film mainly including, for example, copper is embedded, thereby forming the wiring M1 as the first layer coupled to the plugs PG1 to PG3 in the interlayer insulating film IL3.

Accordingly, the semiconductor device of this embodiment is manufactured.

<Operation of Non-Volatile Memory>

Descriptions will now be made to an operation example of the non-volatile memory, by reference to FIG. 34 and FIG. 35.

Figures 34, 35:
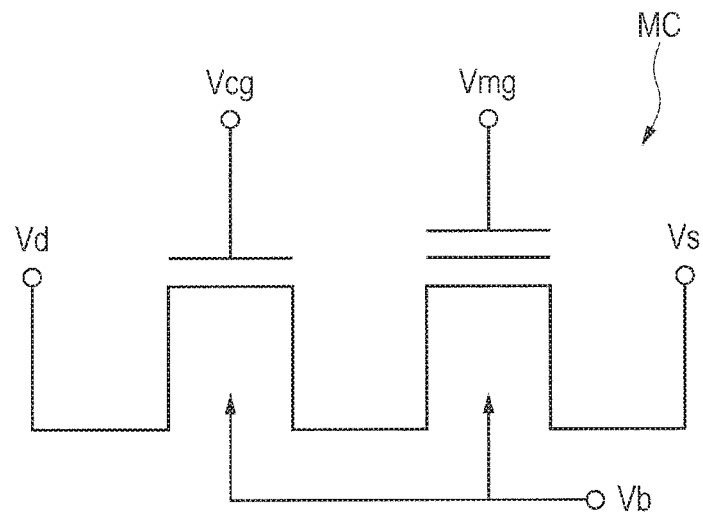
FIG. 34 is an equivalent circuit diagram of a memory cell of a non-volatile memory.
FIG. 35 is a table representing examples of application conditions of a voltage to each part of a selected memory cell at the times of "write", "erase", and "read".

FIG. 34 is an equivalency circuit diagram of the memory cell MC of the non-volatile memory. FIG. 35 is a table representing examples of application conditions of a voltage to each part of a selected memory cell at the times of "write", "erase", and "read". The table of FIG. 35 represents a voltage Vmg to be applied to the memory gate electrode MG of the memory cell MC illustrated in FIG. 34, a voltage Vs to be applied to the source region MS, a voltage Vcg to be applied to the control gate electrode CG, a voltage Vd to be applied to the drain region MD, and a voltage Vb to be applied to the well PW1, in association with "write", "erase", and "read".

The table of FIG. 35 represents only examples of preferable application conditions of voltages. It is not limited to these examples, and various changes are possible as necessary. In this embodiment, "write" is defined as injection of electrons to the charge storage layer CSL in the insulating film ON below the memory gate electrode MG, while "erase" is defined as injection of holes.

The write method may be a method for performing writing using hot electron injection, that is, a so-called source-side injection. For example, a voltage represented in the column of "write" of FIG. 35 is applied to each part of the selected memory cell for writing, and electrons are injected to the charge storage layer CSL of the selected memory cell, thereby performing the writing.

At this time, hot electrons are generated in a channel region below two gate electrodes (the memory gate electrode MG and the control gate electrode CG), and are injected to the charge storage layer CSL below the memory gate electrode MG. The injected hot electrons are captured at a trap level in the charge storage layer CSL. As a result, the threshold voltage of the memory transistor having the memory gate electrode MG is increased. That is, the memory transistor is in a write state.

The erase method may be a method for performing erase by hot hole injection by BTBT (Band-To-Band Tunneling), that is, a so-called a BTBT method. That is, erase is done by injecting the holes generated by the BTBT to the charge storage layer CSL. For example, a voltage represented in the column "erase" of FIG. 35 is applied to each part of the selected memory cell for performing erase. Then, holes are generated by the BTBT phenomenon, and the holes are injected to the charge storage layer CSL of the selected memory cell due to electric field acceleration thereof. As a result, the threshold voltage of the memory transistor is decreased. That is, the memory transistor is in an erase state.

At the time of reading, a voltage represented in the column "read" of FIG. 35 is applied to each part of the selected memory cell for performing reading. The voltage Vmg to be applied to the memory gate electrode MG at the time of reading is made to be a value between the threshold voltage of the memory transistor in the write state and the threshold voltage of the memory transistor in the erasure state, thereby discriminating between the write state and the erase state.

<Main Feature of Semiconductor Device and its Manufacturing Method>

Descriptions will now be made to the main features and effects of the semiconductor device of this embodiment and its manufacturing method, using FIG. 36 and FIG. 37.

As described in FIG. 2, the diameter of the plug PG1 is approximately equal to the distance between the adjacent two control gate electrodes CG. Due to the mask misalignment, the plug PG1 may sometimes be formed on the control gate electrode CG. However, in this embodiment, the cap film CP1 is formed on the control gate electrode CG. Thus, it is possible to prevent that the plug PG1 and the control gate electrode CG are in contact with each other. That is, in this embodiment, it is not necessary the distance between the adjacent two control gate electrodes CG is sufficiently greater than the diameter of the plug PG1, in consideration of the undesirable event of a short circuit between the plug PG1 and the control gate electrode CG. Thus, in the memory cell MC of this embodiment, because it is possible to shorten the distance between the two adjacent control gate electrodes CG, the semiconductor can be miniaturized.

Figure 36:
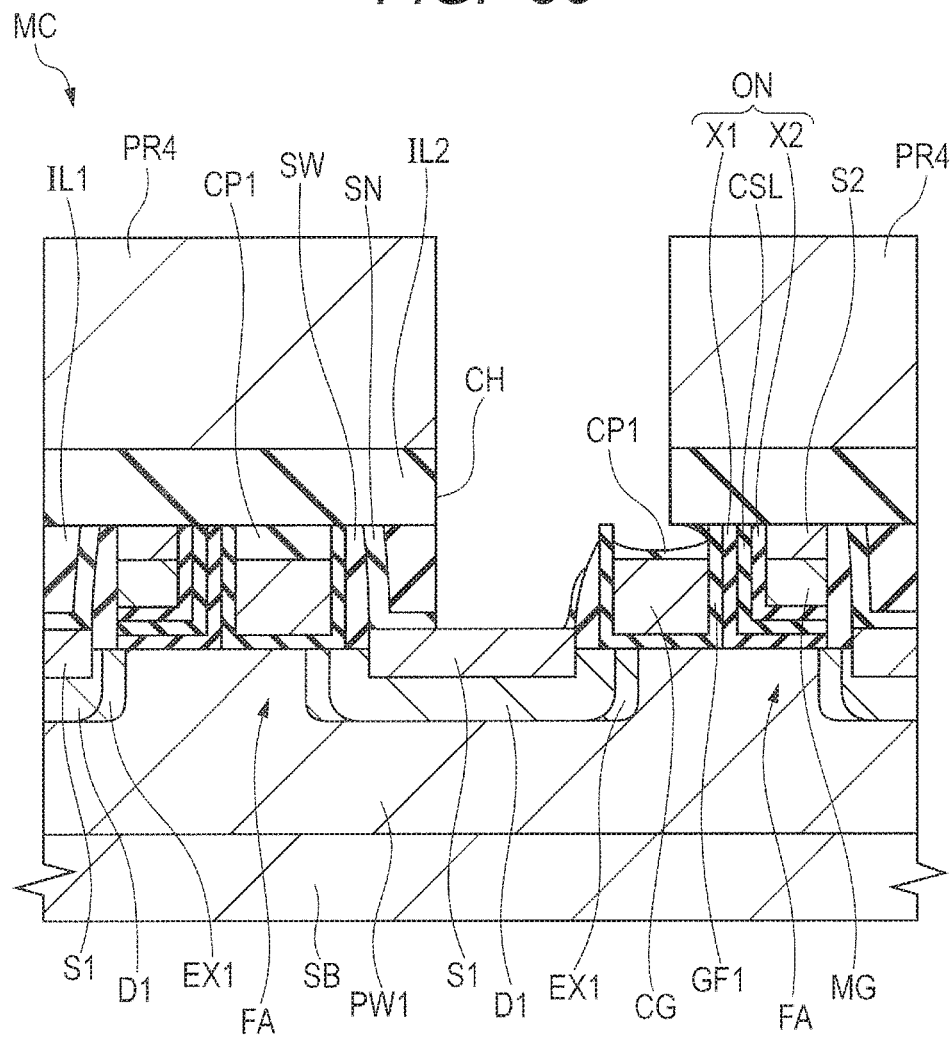
FIG. 36 is a cross sectional view for explaining a manufacturing process for the semiconductor device, after that of FIG. 33.

FIG. 36 is a cross sectional view illustrating a case in which the contact hole CH is formed on the control gate electrode CG due to the mask deviation. FIG. 36 illustrates a process in the midway from the process of FIG. 33 to that of FIG. 4, and illustrates a process at the time of forming the contact hole CH provided to the plug PG1 to be embedded therein, in the interlayer insulating film IL2, the interlayer insulating film IL1, and the insulating film SN, after the formation of the interlayer insulating film IL2.

As illustrated in FIG. 36, in the formation process for the contact hole CH, first, a first dry etching process is performed for the interlayer insulating films IL2 and IL1 mainly including the silicon oxide film with using a resist pattern PR4 as a mask, using mixed gas including, for example, $C_4F_6$, Ar, and $O_2$. At this time, the insulating film SN and the cap film CP1 are formed from an insulating film, such as a silicon nitride film, having a high selection ratio of etching to the silicon oxide film. Thus, the insulating film SN and the cap film CP1 serve as an etching stopper film.

Next, a second dry etching process is performed for the insulating film SN, using mixed gas including, for example, $CHF_3$, Ar and $O_2$. Due to removal of the insulating film SN, the contact hole CH reaches the drain region MD (silicide layer S1). In this case, the second dry etching process is performed with over-etching, in a manner that the insulating film SN does not remain on the surface of the semiconductor wafer surface. When the mask deviation occurs as illustrated in FIG. 36, the contact hole CH is positioned right above the cap film CP1. Thus, the cap film CP1 on the control gate electrode CG is affected by the over-etching, and the etching may sometimes progress not only in the film thickness direction of the cap film CP1, but also in the long-side direction (direction "X" of FIG. 2) of the fin of the cap film CP1. As a result, there may be a risk that the contact hole CH reaches the memory gate electrode MG. In this case, there is a risk that the contact hole CH reaches the silicide layer S2 formed in the upper part of the memory gate electrode MG.

In this case, the insulating film ON is formed between the memory gate electrode MG and the control gate electrode CG. The charge storage layer CSL included in the insulating film ON is also formed from a silicon nitride film. Thus, there is a risk that the insulating film ON is etched by the over-etching. That is, when the over-etching is performed to a great degree, there is a risk that the contact hole CH reaches the memory gate electrode MG, or that the contact hole CH reaches a position very close to the memory gate electrode MG.

Figure 37:
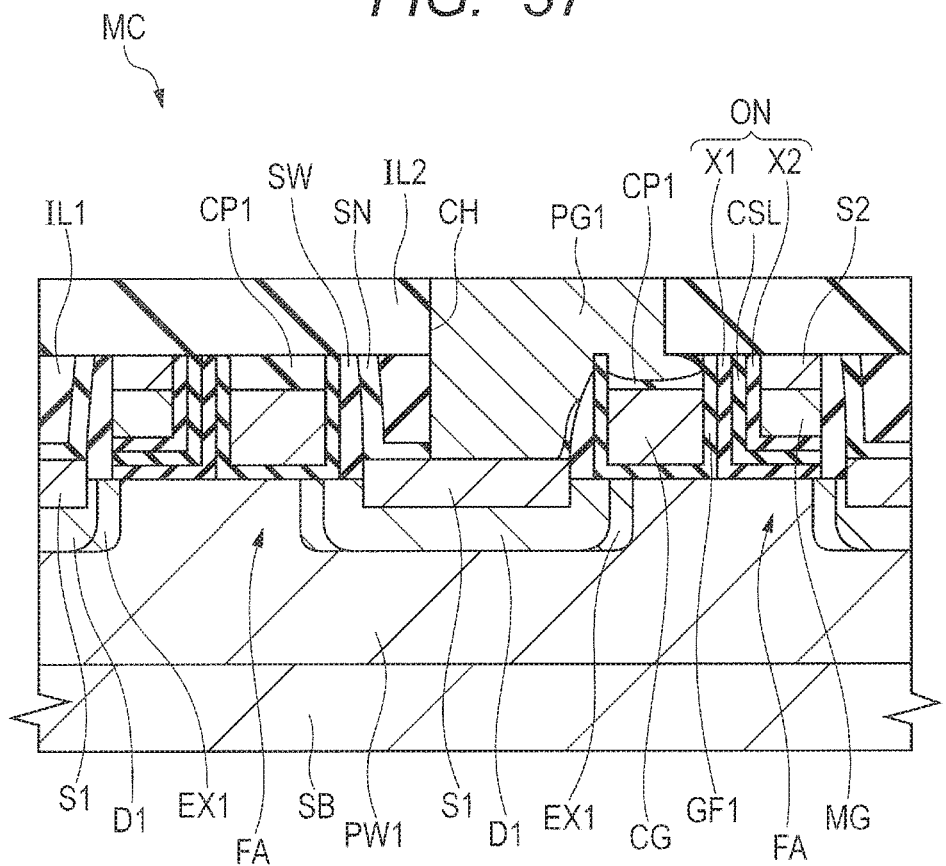
FIG. 37 is a cross sectional view for explaining a manufacturing process for the semiconductor device, after that of FIG. 36.

As illustrated in FIG. 37, when the plug PG1 is embedded in the contact hole CH, a trouble occurs. Specifically, a remarkable decrease occurs in the insulation breakdown between the plug PG1 electrically coupled to the drain region MD and the memory gate electrode MG, or a short circuit occurs between the plug PG1 and the memory gate electrode MG.

In this embodiment, the gate insulating film GF1 is formed not only between the control gate electrode CG and the memory gate electrode MG, but also between the cap film CP1 and the memory gate electrode MG (silicide layer S2). That is, in the process of FIG. 31, when the upper surface of the control gate electrode CG is retreated, the gate insulating film GF1 in the upper part of the opening OP1 can also be retreated. However, in this embodiment, it is intended that the gate insulating film GF1 in the upper part of the opening OP1 remains. As described above, the gate insulating film GF1 is configured with metal oxide as a material which differs from the silicon oxide film and the silicon nitride film. Thus, it can serve as an etching stopper for the above-described over-etching. Therefore, it is possible to reduce the risk that the contact hole CH reaches the memory gate electrode MG, thereby enabling to suppress the risk of the short circuit between the plug PG1 and the memory gate electrode. Thus, it is possible to improve the reliability of the semiconductor device.

(Modification)

Descriptions will now be made to a modification of the first embodiment, using FIG. 38 to FIG. 40.

Figure 38:
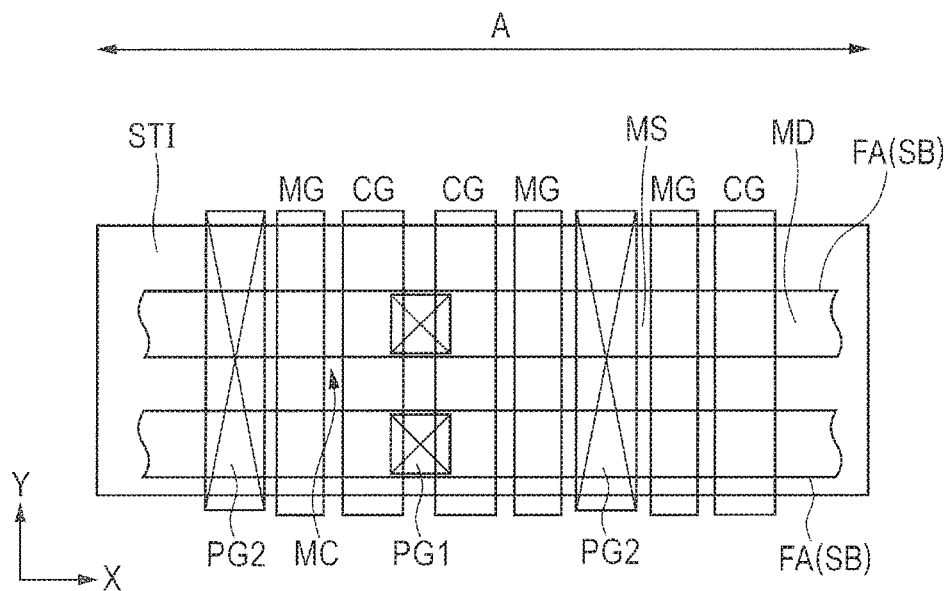
FIG. 38 is a plan view illustrating a semiconductor device according to a modification of the first embodiment.

FIG. 38 is a plan view of a memory cell MC corresponding to that of FIG. 2. FIG. 39 and FIG. 40 are cross sectional views of memory cells MC respectively corresponding to those of FIG. 36 and FIG. 37.

Like the first embodiment, the memory cell is provided symmetrically about the drain region MD (diffusion region D1). Thus, one contact hole CH is shared by two memory cells MC.

As illustrated in FIG. 38, the distance between two adjacent control gate electrodes CG in this modification is shorter than the distance between the adjacent control gate electrodes CG of the first embodiment. In other words, the diameter of the contact hole CH (plug PG1) of this modification is equal to the diameter of the contact hole CH (plug PG1) of the first embodiment, but is greater than the distance between the two adjacent control gate electrodes CG.

Figure 39:
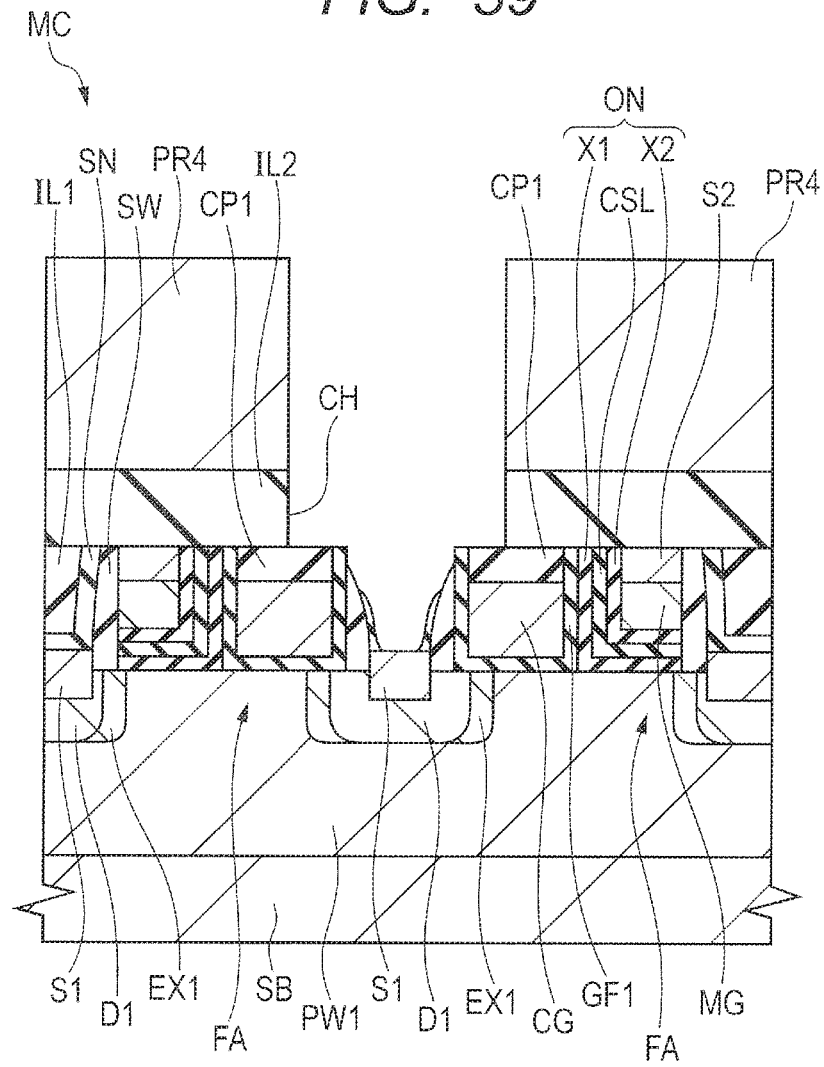
FIG. 39 is across sectional view illustrating a semiconductor device according to a modification of the first embodiment.
Figure 40:
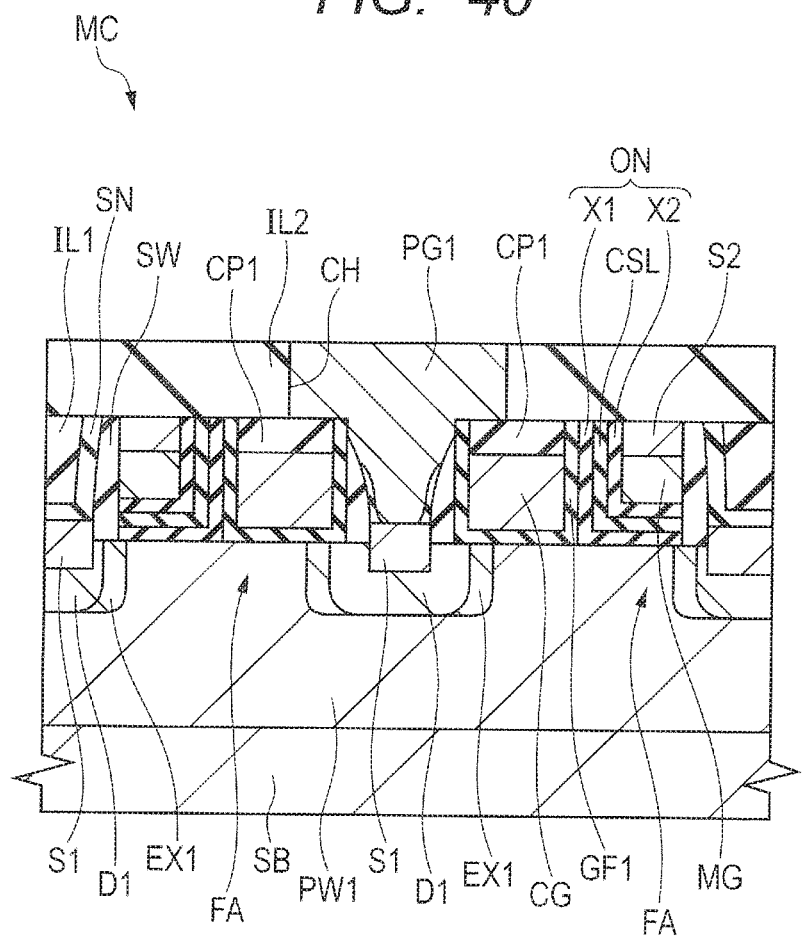
FIG. 40 is across sectional view illustrating a semiconductor device according to a modification of the first embodiment.

That is, as illustrated in FIG. 39, the contact hole CH is positioned right above the two adjacent control gate electrodes CG through the cap film CP1. As illustrated in FIG. 40, the plug PG1 is embedded in the contact hole CH.

Even in this case, the cap film CP1 is formed on each of the two adjacent control gate electrodes CG, thus enabling to suppress that the plug PG1 and the control gate electrode CG are in contact with each other. The gate insulating film GF1 is formed between the cap film CP1 and the memory gate electrode MG, thus enabling to suppress a short circuit between the plug PG1 and the memory gate electrode.

That is, even if the distance between the two adjacent control gate electrodes CG is equal to or shorter than the diameter of the contact hole CH (plug PG1), it is possible to suppress the risk of the short circuit between the plug PG1 and the memory gate electrode.

In the semiconductor device of this modification, the same effect as that of the first embodiment can be realized. In addition, as compared with the first embodiment, it is possible to further reduce the distance between the two adjacent control gate electrodes CG.

The inventions by the present inventors have specifically been described based on the preferred embodiment. The present invention is not limited to the preferred embodiment, and various changes may be made without departing from the scope thereof.

What is claimed is:

1. A semiconductor device comprising:
a first projecting unit which is a part of a semiconductor substrate, projects from an upper surface of the semiconductor substrate, and extends in a first direction along a main surface of the semiconductor substrate;
a first gate electrode which is formed over an upper surface and a side surface of the first projecting unit through a first gate insulating film, and extends in a second direction orthogonal to the first direction;
a second gate electrode which is formed over the upper surface and the side surface of the first projecting unit through a second gate insulating film, is adjacent to a first side surface of the first gate electrode through the second gate insulating film, and extends in the second direction;
a sidewall spacer which is formed beside a second side surface of the first gate electrode on a side opposed to the first side surface;
a semiconductor region which is formed in the first projecting unit beside the sidewall spacer;
a first insulating film which is formed over the semiconductor region;
a first interlayer insulating film which is formed over the first insulating film;
a second interlayer insulating film which is formed over the first interlayer insulating film and the first gate electrode; and
a plug which is formed in the second interlayer insulating film, the first interlayer insulating film, and the first insulating film, in a manner to reach the semiconductor region,
wherein a cap film is formed between the first gate electrode and the second interlayer insulating film,
wherein the plug is positioned also right over the cap film, and
wherein the first interlayer insulating film and the second interlayer insulating film are formed from a material which differs from that of the first insulating film and the cap film.

2. The semiconductor device according to claim 1,
wherein the first gate insulating film is formed along a bottom surface and a side surface of the first gate electrode,
wherein the first gate insulating film is formed between the cap film and the second gate insulating film, and
wherein the first gate insulating film is formed from a material which differs from that of the first insulating film and the cap film.

3. The semiconductor device according to claim 2,
wherein the first gate insulating film and the second gate insulating film are formed between the cap film and the second gate electrode.

4. The semiconductor device according to claim 3,
wherein a silicide layer is formed over the second gate electrode.

5. The semiconductor device according to claim 2,
wherein the first interlayer insulating film and the second interlayer insulating film are formed from silicon oxide,
wherein the first insulating film and the cap film are formed from silicon nitride, and
wherein the first gate insulating film is formed from metal oxide.

6. The semiconductor device according to claim 5,
wherein the metal oxide is an oxide film including hafnium, an oxide film including aluminum, an oxide film including zirconium, or an oxide film including tantalum.

7. The semiconductor device according to claim 1,
wherein the second gate insulating film has a charge storage layer,
wherein the first gate electrode, the first gate insulating film, the second gate electrode, the second gate insulating film, and the semiconductor region form a non-volatile memory.

8. The semiconductor device according to claim 7,
wherein two non-volatile memories which are adjacent to each other are formed symmetrically about the semiconductor region, and
wherein the plug is positioned right over the cap film of each of the adjacent non-volatile memories.

9. A manufacturing method for a semiconductor device, comprising the steps of:
(a) preparing a semiconductor substrate;
(b) retreating a part of the semiconductor substrate, thereby forming a first projecting unit, which is apart of the semiconductor substrate, projects from an upper surface of the semiconductor substrate, and extends in a first direction along a main surface of the semiconductor substrate;
(c) forming a dummy gate electrode over the upper surface and a side surface of the first projecting unit through a first insulating film;
(d) forming a second gate insulating film over the upper surface and the side surface of the first projecting unit and over a first side surface of the dummy gate electrode;
(e) forming a second gate electrode over the upper surface and the side surface of the first projecting unit and over a second side surface of the dummy gate electrode on a side opposed to the first side surface, through the second gate insulating film;
(f) forming a sidewall spacer over the upper surface of the first projecting unit and over the second side surface of the dummy gate electrode, after the step (e);
(g) forming a semiconductor region in the first projecting unit beside the sidewall spacer, using ion implantation;
(h) forming a second insulating film over the semiconductor region;
(i) forming a first interlayer insulating film over the second insulating film;
(j) forming an opening for exposing the first projecting unit between the sidewall spacer and the second gate insulating film, by removing the dummy gate electrode and the first insulating film, after the step (i);
(k) forming a first gate insulating film in the opening;
(l) embedding a first gate electrode in the opening, through the first gate insulating film;
(m) retreating an upper surface of the first gate electrode;
(n) forming a cap film over the first gate electrode in a manner to fill the opening, after the step (m);
(o) forming a second interlayer insulating film over the first interlayer insulating film and the cap film, after the step (n); and (p) forming a contact hole reaching the semiconductor region, in the second interlayer insulating film, the first interlayer insulating film, and the second insulating film, wherein the contact hole is positioned right above the cap film, and wherein the first interlayer insulating film and the second interlayer insulating film are formed from a material which differs from that of the second insulating film and the cap film.

10. The manufacturing method for a semiconductor device, according to claim 9,
wherein the first gate insulating film is formed between the cap film and the second gate electrode, and
wherein the first gate insulating film is formed from a material which differs from that of the second insulating film and the cap film.

11. The manufacturing method for a semiconductor device, according to claim 10,
wherein the first gate insulating film and the second gate insulating film are formed between the cap film and the second gate electrode.

12. The manufacturing method for a semiconductor device, according to claim 11,
wherein a silicide layer is formed over the second gate electrode.

13. The manufacturing method for a semiconductor device, according to claim 9,
wherein, in the step (p), the second insulating film and the cap film serve as an etching stopper, when etching the second interlayer insulating film and the first interlayer insulating film.

14. The manufacturing method for a semiconductor device, according to claim 13,
wherein the step (p) includes the steps of
(P1) etching the second interlayer insulating film and the first interlayer insulating film,
(P2) after the step (P1), etching a part of the cap film, and at a same time etching the second insulating film to form the contact hole reaching the semiconductor region,
wherein, in the step (P1), the second insulating film and the cap film serve as an etching stopper, and
wherein, in the step (P2), the first gate insulating film serves as an etching stopper.

15. The manufacturing method for a semiconductor device, according to claim 11,
wherein the first and second interlayer insulating films are formed from silicon oxide, and
wherein the second insulating film and the cap film are formed from silicon nitride, and
wherein the first gate insulating film is formed from metal oxide.

16. The manufacturing method for a semiconductor device, according to claim 15,
wherein the metal oxide is an oxide film including hafnium, an oxide film including aluminum, an oxide film including zirconium, or an oxide film including tantalum.

17. The manufacturing method for a semiconductor device, according to claim 9,
wherein the second gate insulating film has a charge storage layer, and
wherein the first gate electrode, the first gate insulating film, the second gate electrode, the second gate insulating film, and the semiconductor region form a non-volatile memory.

18. The manufacturing method for a semiconductor device, according to claim 17,
wherein two non-volatile memories which are adjacent to each other are formed symmetrically about the semiconductor region, and
wherein the contact hole is positioned right over the cap film formed over the first gate electrode of each of the adjacent non-volatile memories.

* * * * *